United States Patent
Oaks et al.

(10) Patent No.: US 11,321,500 B1
(45) Date of Patent: May 3, 2022

(54) SMART TAKEOFF ESTIMATION SYSTEMS AND METHODS

(71) Applicant: The Estimating Edge LLC, Boynton Beach, FL (US)

(72) Inventors: Adam P. Oaks, Delray Beach, FL (US); Bassam Saidi, Boynton Beach, FL (US); Nathan M. Good, Dawsonville, GA (US)

(73) Assignee: The Estimating Edge LLC, Boynton Beach, FL (US)

( * ) Notice: Subject to any disclaimer, the term of this patent is extended or adjusted under 35 U.S.C. 154(b) by 0 days.

(21) Appl. No.: 17/412,833

(22) Filed: Aug. 26, 2021

Related U.S. Application Data

(60) Provisional application No. 63/070,342, filed on Aug. 26, 2020.

(51) Int. Cl.
  *G06F 30/13* (2020.01)
(52) U.S. Cl.
  CPC .................. *G06F 30/13* (2020.01)
(58) Field of Classification Search
  CPC .......... G06F 30/13; G06F 30/00; G06F 30/20; G06F 2111/16
  USPC ............................................................. 703/1
  See application file for complete search history.

(56) References Cited

U.S. PATENT DOCUMENTS

| 6,256,595 B1 | 7/2001 | Schwalb et al. |
| 7,752,065 B2 | 7/2010 | Buzz |
| 2004/0019148 A1 | 1/2004 | Suau |
| 2009/0198539 A1 | 8/2009 | Buzz |
| 2010/0138762 A1* | 6/2010 | Reghetti ................. G06T 19/20 715/765 |
| 2013/0194276 A1 | 8/2013 | Sato et al. |
| 2013/0218780 A1 | 8/2013 | Buzz |
| 2014/0244338 A1 | 8/2014 | Buzz |
| 2014/0278267 A1 | 9/2014 | Buzz et al. |
| 2016/0085418 A1 | 3/2016 | Kling et al. |
| 2019/0212991 A1 | 7/2019 | Ye et al. |

(Continued)

OTHER PUBLICATIONS

Dominguez et al., "Semiautomatic Detection of Floor Topology from CAD Architectural Drawings", 2012, Computer-Aided Design, Elsevier Ltd. (Year: 2012).

*Primary Examiner* — Cedric Johnson
(74) *Attorney, Agent, or Firm* — Morris, Manning & Martin, LLP; Bryan D. Stewart

(57) ABSTRACT

A method includes accessing a three-dimensional architectural file of a building. The method further includes extracting architectural data from the three-dimensional architectural file and rendering, from the architectural data, a two-dimensional construction floorplan. Additionally, the method includes filtering the architectural data to generate a set of filtered data and storing the set of filtered data in high-availability storage. Further, the method includes overlaying a set of shapes corresponding to a set of assemblies on the two-dimensional drawing. Furthermore, the method includes assigning a set of measurements identified in the set of filtered data to the set of assemblies, where assigning a measurement to an assembly includes modifying a color of a shape corresponding to the assembly to identify the assembly being assigned the measurement. The method also includes compiling values associated with the measurements of the set of assemblies to generate a bid value.

18 Claims, 16 Drawing Sheets

(56) References Cited

U.S. PATENT DOCUMENTS

2020/0356102 A1\* 11/2020 Morse ................ G05D 1/0219
2021/0055716 A1\* 2/2021 Turner ................ G06F 16/289

\* cited by examiner

FIG. 16

SMART TAKEOFF ESTIMATION SYSTEMS AND METHODS

CROSS REFERENCE TO RELATED APPLICATIONS

This application claims the benefit of, and priority to, U.S. Provisional Patent Application. No. 63/070,342, filed on Aug. 26, 2020, and entitled "SMART TAKEOFF," the disclosure of which is incorporated by reference herein in its entirety.

TECHNICAL FIELD

The present disclosure relates generally to systems and methods for performing building takeoffs, and more particularly to converting architectural files into two-dimensional-based visual representations for generating the building takeoffs.

BACKGROUND

As part of a bid estimation process, contractors historically printed out blueprint drawings of building plans, and a draftsman color-coded the building plans by hand. This process can take several days for the draftsman to complete. For example, the draftsman historically labeled each part/component/material of a drawing and generated a bid estimate by calculating the quantity of like individual parts from the draftsman's drawing, calculating the materials and labor costs and other costs for like individual parts, and totaling all the costs together. This method presented the possibility of introducing human error into the estimation calculation, because the draftsman may mislabel a part or incorrectly calculate the amount of a material needed to complete the building. Other third-party systems used to assist in the estimate calculation may rely on inputs from the contractor before assisting in the calculation. Thus, contractors that use third-party systems may not only introduce human errors into the estimate due to mislabeling a part or an incorrect calculation, but may also introduce wrong amounts or calculations due to typographical errors.

Therefore, there is a long-felt but unresolved need for a system that converts a three-dimensional architectural file to one or more two-dimensional drawings, accurately labels the individual pieces, and calculates an estimate based on the labeling and other associated information of the individual pieces.

BRIEF SUMMARY OF THE DISCLOSURE

Briefly described, and according to one embodiment, aspects of the present disclosure generally relate to systems and methods for converting architectural files into two-dimensional-based visual contracting estimates. In various embodiments, the disclosed system accesses and extracts architectural data from a three-dimensional architectural file. Using the extracted architectural data, the disclosed system may filter the extracted architectural data to generate a set of filtered data. In particular embodiments, the disclosed system stores the filtered data into a high-availability storage. In some embodiments, the disclosed system uses a set of measurement identifiers in the set of filtered data to assign the measurement identifiers into a set of assemblies. The disclosed system may compile values associated with the measurements of the set of assemblies to generate a bid value.

In various embodiments, the disclosed system receives the three-dimensional (hereinafter also referred to as "3D") architectural file, such as, but not limited to, Revit building information modeling (BIM) file (.rvt), .cad, .dwg, .ifc, and .dwf files. In one or more embodiments, 3D files include metadata that include identification information. In particular embodiments, the identification information of the metadata includes family properties and shape locations, and other associated information for individual components and/or materials used in the 3D file. In some embodiments, the disclosed system extracts the metadata from the 3D file and converts the 3D file into one or more two-dimensional drawings. In at least one embodiment, the disclosed system may receive more than one 3D file for converting into one or more two-dimensional drawings.

In many embodiments, the disclosed system either extracts certain targeted metadata from the 3D file, or extracts all the metadata from the 3D file and filters the metadata once extracted. In at least one embodiment, the disclosed system stores the metadata in a relational database and/or other data storage system. In various embodiments, the metadata is filtered or sorted in the relational database and/or other data storage systems by identifying the individual part's metadata. In several embodiments, the disclosed system uses the metadata from the 3D file to identify an individual component and/or assign the individual components or materials into different families, where the families correspond to the different types of components or materials in the architectural file/building plan. In some embodiments, the metadata includes location data of the individual component within the one or more two-dimensional drawings and/or includes linkage information for individual components connected to each other. In one or more embodiments, the system may create one or more two-dimensional drawings. In many embodiments, the metadata may also include geometry data for each shape, which may include two-dimensional (x, y) coordinate information and/or shape perimeter information. In at least one embodiment, the disclosed system maps the shapes onto the one or more two-dimensional drawings based on the metadata information of the individual shape, such as, but not limited to, geometry data, shape location and/or shape type.

In various embodiments, a user selects and/or filters families to highlight the families in the two-dimensional drawings. In many embodiments, once the user has selected the families, the disclosed system runs each individual component through an estimation database to identify the amount of material needed and other associated costs for the individual component. For example, in one embodiment, the disclosed system identifies an individual component as a PVC pipe of a certain diameter, and based on the metadata, determines the length of PVC pipe required for the individual component and other associated costs. In several embodiments, once the disclosed system identifies the quantity of material for the individual components of a family or assembly, the disclosed system may input the data to a spreadsheet that can be exported to a third-party system for further estimations. In multiple embodiments, the disclosed system determines information within the 3D files to calculate a time and cost estimate for the contracting work for the building or a system of a building based on the amount of parts in each individual group.

According to a first aspect, a computer-implemented method in which one or more processing devices perform operations including: A) accessing a three-dimensional architectural file of a building; B) extracting architectural data from the three-dimensional architectural file; C) rendering, from the architectural data extracted from the three-dimensional architectural file, a two-dimensional drawing representing a floorplan of a floor of the building; D) filtering the architectural data to generate a set of filtered data; storing the set of filtered data in high-availability storage; E) overlaying a set of shapes corresponding to a set of assemblies on the two-dimensional drawing; F) assigning a set of measurements identified in the set of filtered data to the set of assemblies, wherein assigning a measurement of the set of measurements to an assembly of the set of assemblies includes modifying a color of a shape corresponding to the assembly to identify the assembly being assigned the measurement; and G) compiling values associated with the measurements of the set of assemblies to generate a bid value.

According to a further aspect, the computer-implemented method of the first aspect or any other aspect, wherein the operations further include: A) adding a representation of a missing element to the two-dimensional drawing representation; B) assigning an additional measurement identified in the set of filtered data to the representation of the missing element; and C) compiling values associated with the additional measurement of the representation of the missing element to generate the bid value.

According to a further aspect, the computer-implemented method of the first aspect or any other aspect, wherein the operations further include: A) storing the extracted architectural data in cloud storage, wherein the set of filtered data is generated by filtering the architectural data in the cloud storage.

According to a further aspect, the computer-implemented method of the first aspect or any other aspect, wherein the filtered data includes metadata associated with the set of assemblies identified during the operation of filtering the architectural data.

According to a further aspect, the computer-implemented method of the first aspect or any other aspect, wherein the metadata includes measurement and location information associated with the set of assemblies.

According to a further aspect, the computer-implemented method of the first aspect or any other aspect, wherein the high-availability storage includes high-availability tables stored in a structured query language (SQL) server.

According to a further aspect, the computer-implemented method of the first aspect or any other aspect, wherein the operations further include: A) filtering the architectural data to generate a second set of filtered data different from the set of filtered data; B) removing the set of filtered data from the high-availability storage; C) storing the second set of filtered data in the high-availability storage; D) assigning a second set of measurements identified in the second set of filtered data to a second set of assemblies; and E) compiling second values associated with the second set of measurements of the second set of assemblies to generate a second bid value.

According to a further aspect, the computer-implemented method of the first aspect or any other aspect, wherein the architectural data includes (i) a set of two-dimensional construction plans generated from the three-dimensional architectural file and (ii) a set of metadata associated with building components identified in the three-dimensional architectural file.

According to a second aspect, a system includes: A) a processor; and B) a non-transitory computer-readable medium having instructions stored thereon, the instructions executable by the processor for performing operations including: 1) accessing a three-dimensional architectural file of a building; 2) extracting architectural data from the three-dimensional architectural file; 3) filtering the architectural data to generate a set of filtered data; 4) storing the set of filtered data in high-availability storage; 5) assigning a set of measurements identified in the set of filtered data to a set of assemblies; and 6) compiling values associated with the measurements of the set of assemblies to generate a bid value.

According to a further aspect, the system of the second aspect or any other aspect, wherein the operations further include: A) rendering, from the architectural data extracted from the three-dimensional architectural file, a two-dimensional drawing representing a floorplan of a floor of the building; and B) overlaying a set of shapes corresponding to the set of assemblies on the two-dimensional drawing, wherein assigning a measurement of the set of measurements to an assembly of the set of assemblies includes modifying a color of a shape corresponding to the assembly to identify the assembly being assigned the measurement.

According to a further aspect, the system of the second aspect or any other aspect, wherein the architectural data includes (i) a set of two-dimensional construction plans generated from the three-dimensional architectural file and (ii) a set of metadata associated with building components identified in the three-dimensional architectural file.

According to a further aspect, the system of the second aspect or any other aspect, wherein the filtered data includes metadata associated with the set of assemblies identified during the operation of filtering the architectural data, and wherein the metadata includes measurement and location information associated with the set of assemblies.

According to a further aspect, the system of the second aspect or any other aspect, wherein the operations further include: A) storing the extracted architectural data in cloud storage, wherein the set of filtered data is generated by filtering the architectural data in the cloud storage.

According to a further aspect, the system of the second aspect or any other aspect, wherein the high-availability storage includes high-availability tables stored in a structured query language (SQL) server.

According to a further aspect, the system of the second aspect or any other aspect, wherein the operations further include: A) filtering the architectural data to generate a second set of filtered data different from the set of filtered data; B) removing the set of filtered data from the high-availability storage; C) storing the second set of filtered data in the high-availability storage; D) assigning a second set of measurements identified in the second set of filtered data to a second set of assemblies; and E) compiling second values associated with the second set of measurements of the second set of assemblies to generate a second bid value.

According to a third aspect, a non-transitory computer-readable medium having program code that is stored thereon, the program code executable by one or more processing devices for performing operations including: A) accessing a three-dimensional architectural file of a building; B) extracting architectural data from the three-dimensional architectural file; C) filtering the architectural data to generate a set of filtered data; D) storing the set of filtered data in high-availability storage; E) assigning a set of measurements identified in the set of filtered data to a set of assemblies; and F) compiling values associated with the measurements of the set of assemblies to generate a bid value.

According to a further aspect, the non-transitory computer-readable medium of the third aspect or any other aspect, wherein the architectural data includes (i) a set of two-dimensional construction plans generated from the three-dimensional architectural file and (ii) a set of metadata associated with building components identified in the three-dimensional architectural file.

According to a further aspect, the non-transitory computer-readable medium of the third aspect or any other aspect, wherein the operations further include: A) storing the extracted architectural data in cloud storage, wherein the set of filtered data is generated by filtering the architectural data in the cloud storage.

According to a further aspect, the non-transitory computer-readable medium of the third aspect or any other aspect, wherein the high-availability storage includes high-availability tables stored in a structured query language (SQL) server.

According to a further aspect, the non-transitory computer-readable medium of the third aspect or any other aspect, wherein the operations further include: A) rendering, from the architectural data extracted from the three-dimensional architectural file, a two-dimensional drawing representing a floorplan of a floor of the building; and B) overlaying a set of shapes corresponding to the set of assemblies on the two-dimensional drawing, wherein assigning a measurement of the set of measurements to an assembly of the set of assemblies includes modifying a color of a shape corresponding to the assembly to identify the assembly being assigned the measurement.

These and other aspects, features, and benefits of the claimed embodiments will become apparent from the following detailed written description of embodiments and aspects taken in conjunction with the following drawings, although variations and modifications thereto may be effected without departing from the spirit and scope of the novel concepts of the disclosure.

BRIEF DESCRIPTION OF THE DRAWINGS

The accompanying drawings illustrate one or more embodiments and/or aspects of the disclosure and, together with the written description, serve to explain the principles of the disclosure. Wherever possible, the same reference numbers are used throughout the drawings to refer to the same or like elements of an embodiment, and wherein:

FIG. 16 illustrates an estimate page, according to certain embodiments of the present disclosure.

DETAILED DESCRIPTION

Figure 1:
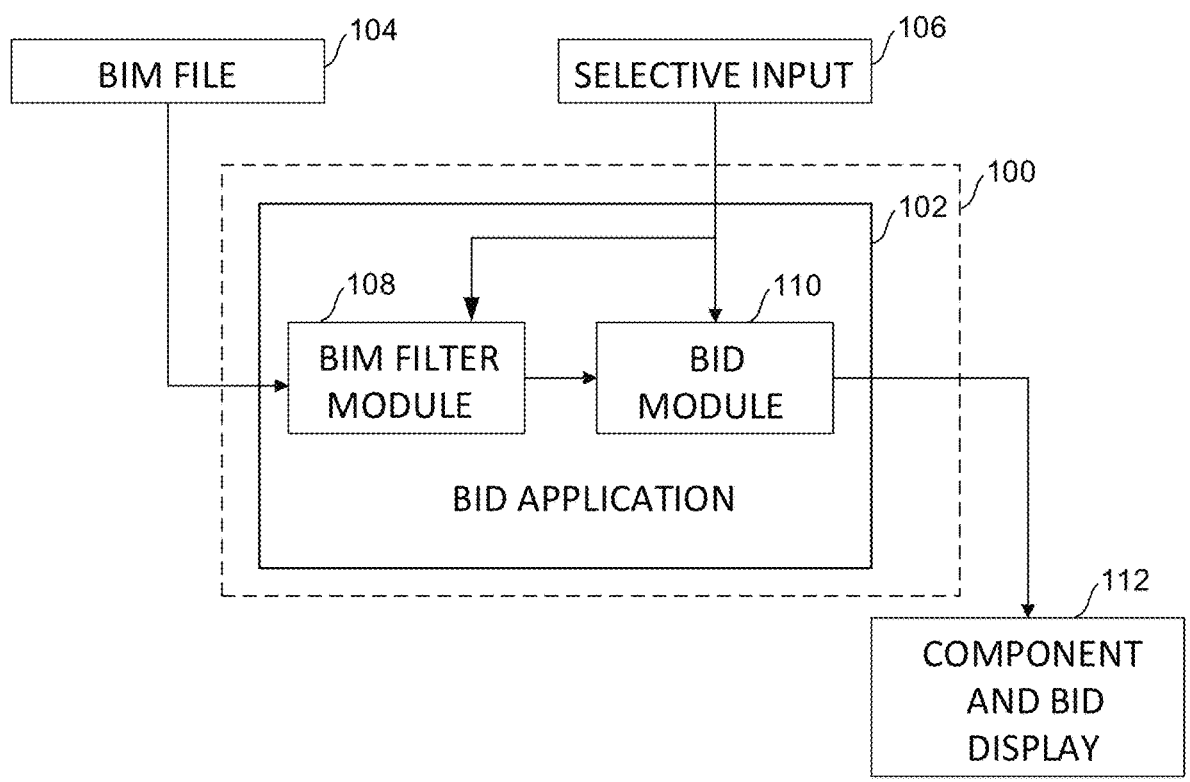
FIG. 1 illustrates an example of a computing environment for performing bid takeoff estimates, according to certain embodiments of the present disclosure.

The present disclosure relates to bid value generation from a three-dimensional architectural file. In various embodiments, the disclosed system receives a three-dimensional (hereinafter also referred to as "3D") architectural file, such as, but not limited to, Revit building information modeling (BIM) file (.rvt), .cad, .dwg, .ifc, and .dwf files. In one or more embodiments, 3D files include metadata that include identification information. In particular embodiments, the identification information of the metadata includes family properties and shape locations and other associated information for individual components and/or materials used in the 3D file. In some embodiments, the disclosed system extracts the metadata from the 3D file and converts the 3D file into one or more two-dimensional drawings. In at least one embodiment, the disclosed system may receive more than one 3D file for converting into one or more two-dimensional drawings.

In many embodiments, the disclosed system either extracts certain targeted metadata from the 3D file, or extracts all the metadata from the 3D file and filters the metadata once extracted. In at least one embodiment, the disclosed system stores the metadata in a relational database and/or other data storage system. In various embodiments, the metadata is filtered or sorted in the relational database and/or other data storage systems by identifying an individual part's metadata. In several embodiments, the disclosed system uses the metadata from the 3D file to identify an individual component and/or assign the individual components/materials into different families, where the families correspond to the different types of components/materials in the architectural file/building plan. In some embodiments, the metadata includes location data of the individual component within the one or more two-dimensional drawings and/or includes linkage information for individual components connected to each other. In one or more embodiments, the system may create one or more two-dimensional drawings. In many embodiments, the metadata may also include geometry data for each shape, which may include two-dimensional (x, y) coordinate information and/or shape perimeter information. In at least one embodiment, the disclosed system maps the shapes onto the one or more two-dimensional drawings based on the metadata information of the individual shape, such as, but not limited to, geometry data, shape location and/or shape type.

In various embodiments, a user selects and/or filters families to highlight the families in the two-dimensional drawings. In many embodiments, once the user has selected the families, the disclosed system runs each individual component through an estimation database to identify the amount of material needed and other associated costs for the individual component. For example, in one embodiment, the disclosed system identifies an individual component as a PVC pipe of a certain diameter, and based on the metadata, determines the length of PVC pipe required for the individual component and other associated costs. In several embodiments, once the disclosed system identifies the quantity of material for the individual components of a family or assembly, the disclosed system may input the data to a spreadsheet that may be exported to a third-party system for further estimations. In multiple embodiments, the disclosed system determines information within the 3D files to calculate a time and cost estimate for the contracting work for the building or a system of a building based on the amount of parts in each individual group.

As described herein, certain embodiments provide improvements in computing system functionality by, for example, filtering large amounts of data into a relevant and usable set of filtered data. The filtering operation utilizes accessibility tiers of memory to maintain the set of filtered data in a high-availability storage, while the large amounts of data extracted from a 3D architectural file is maintained in less readily available storage, such as in a remote cloud storage system. Accordingly, operations of the computing system may be efficiently performed using the filtered data in high-availability storage, and subsequent filtering operations resulting in subsequent sets of filtered data may be performed on the extracted data from 3D architectural file that is stored in the less readily-available storage. The storage structure described herein thus improves the functionality of the computing system by providing efficient access to relevant sets of filtered data in the high-availability storage while maintaining the larger amounts of data extracted from the 3D architectural file in less readily available storage for future processing.

Whether a term is capitalized is not considered definitive or limiting of the meaning of a term. As used in this document, a capitalized term shall have the same meaning as an uncapitalized term, unless the context of the usage specifically indicates that a more restrictive meaning for the capitalized term is intended. However, the capitalization or lack thereof within the remainder of this document is not intended to be necessarily limiting unless the context clearly indicates that such limitation is intended.

Overview

For the purpose of promoting an understanding of the principles of the present disclosure, reference will now be made to the embodiments illustrated in the drawings and specific language will be used to describe the same. It will, nevertheless, be understood that no limitation of the scope of the disclosure is thereby intended; any alterations and further modifications of the described or illustrated embodiments, and any further applications of the principles of the disclosure as illustrated therein are contemplated as would normally occur to one skilled in the art to which the disclosure relates. All limitations of scope should be determined in accordance with and as expressed in the claims.

Aspects of the present disclosure generally relate to systems and methods for converting architectural files into two dimensional-based visual contracting estimates.

EXEMPLARY EMBODIMENTS

Referring now to the figures, for the purposes of example and explanation of the fundamental processes and components of the disclosed systems and processes, reference is made to FIG. 1, which illustrates an exemplary computing environment 100. As will be understood and appreciated, the exemplary, computing environment 100 shown in FIG. 1 represents merely one approach or embodiment of the present system, and other aspects are used according to various embodiments of the present system. In one or more embodiments, the computing environment 100 receives a BIM file 104 and a selective input 106. The computing environment 100 may analyze the BIM file 104 and the selective input 106 to output a component and bid display 112.

In various embodiments, the BIM file 104 is defined as a building information modeling file, which stores information regarding a three-dimensional (hereinafter "3D") construction project. While FIG. 1 is described with respect to the BIM file 104, it may be appreciated by those skilled in the art that the BIM file 104 may be any 3D architectural file format. In particular embodiments, the BIM file 104 is the output of a 3D design system, such as Revit. In one or more embodiments, the BIM file 104 typically includes information about building components (e.g., walls, plumbing, roofing, etc.) to be constructed. In certain embodiments, the computing environment 100 receives other types of 3D files that have similar content/data as the BIM file 104. In at least one embodiment, the BIM file 104 contains metadata, which includes data about the various components of a building or structure. In some embodiments, the metadata information includes, but is not limited to, information about materials, quantity of materials, sizes, shapes, and dimensions of various building components. In one or more embodiments, the BIM file 104 includes data identifying a particular part or building component family for a particular part (e.g., a pipe may be identified as part of a "plumbing" family).

In some embodiments, the computing environment 100 receives the selective input 106. The selective input 106 may be defined as any information related to a particular takeoff estimation project received by the computing environment 100. In one or more embodiments, the selective input 106 includes additional missing takeoff information, data filtering information, assignment information for assigning entities to assemblies, and/or any additional data pertaining to a takeoff estimation project.

In particular embodiments, the computing environment 100 includes a bid application 102. In some embodiments, the bid application 102 is implemented using a computing network (e.g., a cloud computing network, software-as-a-service implementation). That is, the bid application 102 may be hosted in the cloud or on a remote server and be accessible by other computing devices. The bid application 102 includes a BIM filter module 108 and a bid module 110.

The BIM filter module 108 of the bid application 102 may process a BIM file 104 to extract pertinent metadata. In various embodiments, the disclosed system includes one or more processors 202, as described below with respect to FIG. 2, that execute instructions associated with the BIM filter module 108 for extracting the metadata (and other data) from the BIM file 104. In some embodiments, the BIM file 104 is commonly a large file. According to at least one embodiment, to extract metadata effectively and efficiently, the BIM filter module 108 utilizes one or more algorithms that leverage hardware and asynchronous parallel batch processing to extract the metadata. In several embodiments, batch processing is utilized for application tasks that may run with minimal or no end user interaction. In one or more embodiments, parallel batch processing utilizes the one or more processors 202 that execute a plurality of tasks at the same time. In at least one embodiment, asynchrony refers to an occurrence of an event independent of the processor 202 executing a main program, which enables the main program to continue running without having to wait on results from the asynchronous program or task.

In at least one embodiment, the BIM filter module 108 may utilize a third-party application to extract the metadata from the BIM files 104. In at least one embodiment, the BIM filter module 108 stores the metadata and the filtered metadata in a memory 204, as described below with respect to FIG. 2. In an additional embodiment, the BIM filter module 108 may store the extracted BIM data from the BIM file 104 at a cloud storage system, and the BIM filter module 108 may store filtered metadata in the memory 204 that is local to the computing environment 100. In one or more embodiments, the BIM filter module 108 identifies the specific components of the building plan in the BIM file 104 and categorizes the specific components, which are also known as "shapes." In several embodiments, the shapes may have a list of properties. In some embodiments, the BIM filter module 108 filters the shapes into families or assemblies based on like properties between individual shapes. For example, in the Revit application (but also applicable with all BIM files and/or other construction related file types), each shape has an ID number and family/type name, which is stored in the metadata of the BIM file output by Revit. Continuing this example, the BIM filter module 108 extracts the metadata and filters the individual ID numbers into families based on the family/type name for the shape.

In some embodiments, the BIM filter module 108 performs a multi-layered filtering process when extracting data from the BIM file 104. In various embodiments, the BIM filter module 108 extracts pertinent metadata from the BIM file 104 using numerous algorithms described herein. Algorithms employed by the BIM filter module 108 may include any form of computational algorithm implemented to extract relevant metadata from the BIM file 104. In particular embodiments, the BIM filter module 108 produces a request for additional information related to the extracted data. In one or more embodiments, the BIM filter module 108 produces a variety of options related to filtering of the extracted metadata. For example, the BIM filter module 108 may provide a user interface that requests filter terms from a user. In the example, the user interface may receive input from a user providing a bid for installing doors in the building that requests the extracted data to be filtered into information relevant to a number of doors there are in the project and what type of doors are being used. In various embodiments, the BIM filter module 108 receives the selective input 106 related to particular filter terms and uses the selective input 106 to filter the metadata. The filtered metadata may be stored using high-availability storage. As used herein, high-availability storage may refer to a storage system that is continuously operational or provides at least 99% uptime. In some examples, the high-availability storage may be high-availability tables stored in a structured query language (SQL) server.

In one or more embodiments, the BIM filter module 108 creates a second filtered dataset after a first filtered dataset has been created from the extracted data of the BIM file 104. In some embodiments, when the BIM filter module 108 creates the second filtered dataset, the first filtered dataset is removed from the high-availability storage and replaced with the second filtered dataset. In some examples, upon commencement of an operation that generates the second filtered dataset, the first filtered dataset may be maintained in a different storage location than the high-availability storage. For the foregoing discussion, any action performed on the first filtered dataset can equally be performed on the second filtered dataset.

In particular embodiments, the bid application 102 includes a bid module 110. In some embodiments, the bid module 110 is a computing system that analyzes, creates, stores, and shares information related to processed metadata. In several embodiments, the bid module 110 utilizes the filtered metadata from the BIM file 104 to superimpose the 3D building plans onto one or more two-dimensional drawings. In at least one embodiment, the bid module 110 creates one or more two-dimensional drawings, utilizing the metadata from the BIM file 104, to represent floorplans of the building depicted in the BIM file 104. In many embodiments, the bid module 110 utilizes the metadata for each shape, such as the individual shape structural information, grid location information, geometry data, and coordinate information, to overlay the shapes onto the one or more two-dimensional drawings.

In multiple embodiments, the bid module 110 transforms the coordinate data for each shape from a BIM file 104 into x and y coordinates in XML format. In at least one embodiment, the bid module 110 plots/overlays each shape on a two-dimensional drawing based on the x and y coordinates in XML format. In one or more embodiments, the bid module 110 utilizes a scale value from the metadata such that each shape is overlaid to scale relative to other shapes and/or the two-dimensional drawing. In some embodiments, the bid module 110 captures the exact specifications for each individual shape of the building plan from the metadata.

In various embodiments, the specifications for each shape may be the length, diameter, types of bends, and/or material for piping, the length and type of drywall, information concerning wiring for electrical systems, HVAC information, and/or any specification information disclosed in the BIM file 104 for building a structure. In one or more embodiments, the bid module 110 processes the shape data extracted from the memory 204.

In multiple embodiments, the bid module 110, with every individual shape from the BIM file identified by the BIM filter module 108, attaches a condition to each individual shape, where a condition is prebuilt for the individual user. In one or more embodiments, each condition assigned by the bid module 110 corresponds to an estimation database that includes contracting estimate information for each condition. In some embodiments, the contracting estimate information includes labor costs, material costs (such as paint costs), building time estimation information, and other such information that may be necessary to include in an estimate for a contractor to make a bid on a building project. In various embodiments, once a condition is attached to a shape, the bid module 110 begins calculating an estimate. In some embodiments, the same condition attaches to all shapes with the same family, type identification, or other filtered property as defined by the selective input 106. In one embodiment, the condition attachment enables the bid module 110 to group the specific individual shapes into larger filtered property groups (also known as pages), where each family of shapes has the same make-up. For example, all the interior drywall may be in one filtered property because the type of drywall used is the same throughout the building plans, despite some drywall lengths or heights being different throughout the building plans. As another example, the bid module 110 may identify a specific diameter and material of piping as one filter (such as one-inch diameter PVC pipes) and the same specific diameter but a different material of piping as a separate filter (such as one-inch diameter steel pipes). In various embodiments, the bid module 110 categorizes the specific shapes into filters based on the inherent properties of the individual shapes.

In particular embodiments, the bid module 110 produces a component and bid display 112. In various embodiments, the component and bid display 112 is defined as a user interface that displays the two-dimensional drawings and any information calculated by the bid application 102. In some embodiments, the component and bid display 112 includes, but is not limited to, cost estimations for particular families, cost estimations for an entire project, cost estimations for a combination of expenses, gross revenue, profit, estimated retail cost of project, and a two-dimensional editable construction drawing.

In at least one embodiment, the bid application 102 displays the one or more converted two-dimensional drawings on the component and bid display 112. In some embodiments, the bid application 102 color-codes each family for the one or more two-dimensional drawings, which enables the user to more easily visualize the locations of the individual shapes within a family in the component and bid display 112. In one embodiment, the bid application 102 receives family selections from the user, which toggles the view of particular families in a one or more two-dimensional drawings of the component and bid display 112.

In multiple embodiments, once the bid module 110 has assigned the proper condition to each shape in the BIM file 104, the bid module 110 begins the estimation process by calculating the amount of a building material needed and the associated costs of the amount of building material using the estimation database. Using an HVAC system as an example, the bid module 110 may calculate the total length of air ducting, the type of HVAC unit(s), and associated electrical wiring needs, and, using the estimation database, calculate an estimate that includes labor costs, materials costs, and/or an estimated installation time. In some embodiments, the bid module 110 enables a user to filter the families so that the user is only creating an estimate for the families that the user desires. For example, a drywall installer could filter the families so that the bid module 110 only provides an estimate for the families associated with drywall installation.

In multiple embodiments, the bid module 110 may produce a spreadsheet file containing data that may be downloaded onto a secondary application for further use by the user. In a several embodiments, the data within the spreadsheet file may contain quantity information (e.g., quantity of a material, such as dry wall) from the bid application 102. In some embodiments, the bid application 102 receives a label assignment for a particular spreadsheet file so that the spreadsheet file includes the label and the user may identify the quantity information from the label. In another embodiment, the bid application 110 produces an editable base estimate that a user may change.

Figure 2:
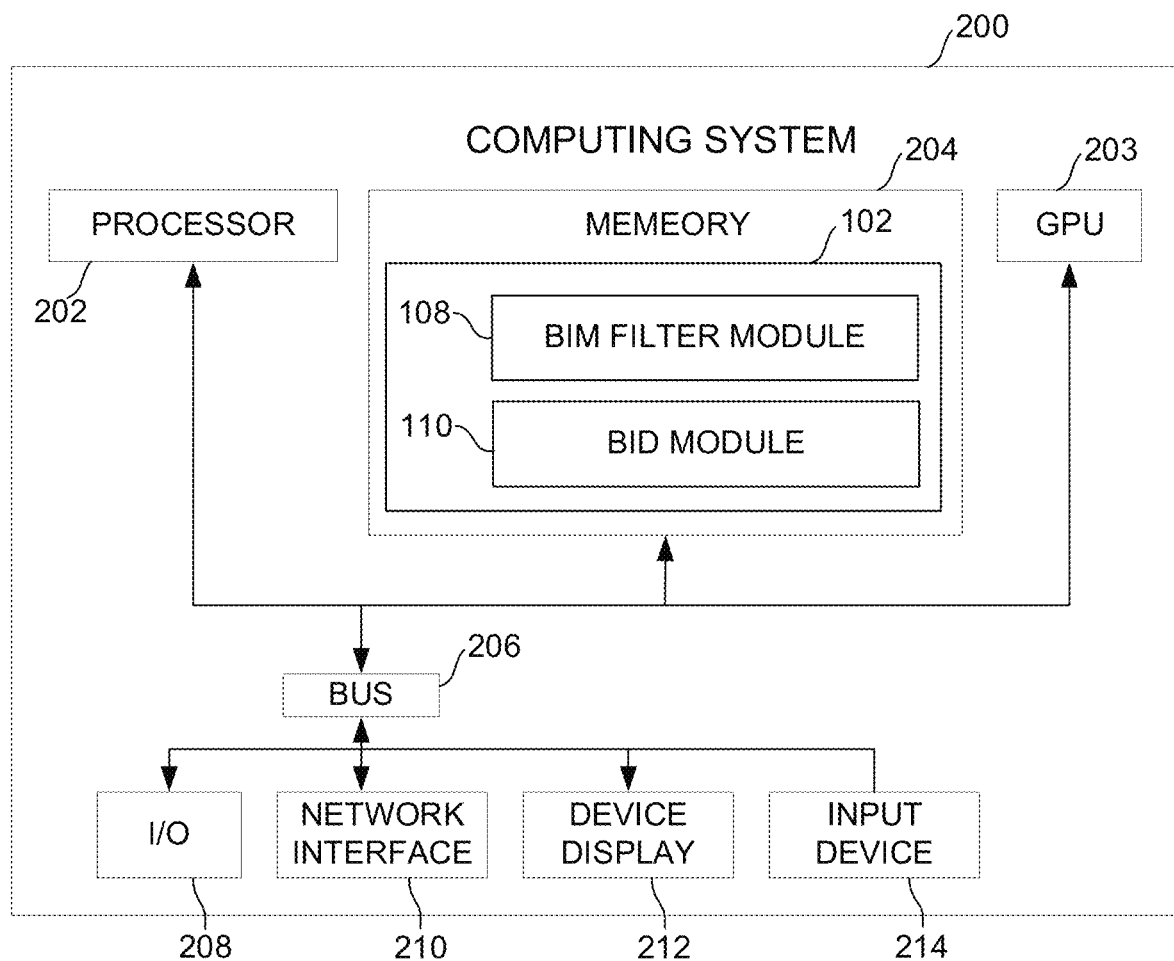
FIG. 2 illustrates an example of a computing system that executes takeoff estimation applications for performing certain embodiments of the present disclosure.

Any suitable computing system or group of computing systems may be used for performing the operations described herein. For example, FIG. 2 depicts an example of a computing system 200 that may implement the computing environment of FIG. 1. In some embodiments, the computing system 200 includes a processor 202 that executes the bid application 102, a memory 204 that stores various data computed or used by the bid application 102, an input device 214 (e.g., a mouse, a stylus, a touchpad, a touchscreen, etc.), and a display device 212 that displays graphical content generated by the bid application 102. For illustrative purposes, FIG. 2 depicts a single computing system on which the bid application 102 is executed, and the input device 214 and display device 212 are present. But these applications, datasets, and devices may be stored or included across different computing systems having devices similar to the devices depicted in FIG. 2.

The depicted example of a computing system 200 includes the processor 202 communicatively coupled to one or more memory devices 204. The processor 202 executes computer-executable program code stored in a memory device 204, accesses information stored in the memory device 204, or both. Examples of the processor 202 include a microprocessor, an application-specific integrated circuit ("ASIC"), a field-programmable gate array ("FPGA"), or any other suitable processing device. The processor 202 may include any number of processing devices, including a single processing device. In an example, the computing system 200 includes a graphics processing unit (GPU) 203. In another example, the processor 202 may be configured to perform the functions of the GPU 203 described herein (e.g., by causing the processor 202 to execute specialized graphics processing software).

The memory device 204 includes any suitable non-transitory computer-readable medium for storing data, program code, or both. A computer-readable medium may include any electronic, optical, magnetic, or other storage device capable of providing a processor with computer-readable instructions or other program code. Non-limiting examples of a computer-readable medium include a magnetic disk, a memory chip, a ROM, a RAM, an ASIC, optical storage, magnetic tape or other magnetic storage, or any other medium from which a processing device may read instructions. The instructions may include processor-specific instructions generated by a compiler or an interpreter from code written in any suitable computer-programming language, including, for example, C, C++, C#, Visual Basic, Java, Python, Perl, JavaScript, and ActionScript.

The computing system 200 may also include a number of external or internal devices, such as the input device 214, the display device 212, or other input or output devices. For example, the computing system 200 is shown with one or more input/output ("I/O") interfaces 208. An I/O interface 208 may receive input from input devices or provide output to output devices. One or more buses 206 are also included in the computing system 200. In an example, the buses 206 communicatively couple one or more components of the computing system 200.

The computing system 200 executes program code that configures the processor 202 to perform one or more of the operations described herein. The program code includes, for example, the bid application 102 or other suitable applications that perform one or more operations described herein. The program code may be resident in the memory device 204 or any suitable computer-readable medium and may be executed by the processor 202 or any other suitable processor. In some embodiments, all modules in the bid application 102 (e.g., the BIM filter module 108, the bid module 110, etc.) are stored in the memory device 204, as depicted in FIG. 2. In additional or alternative embodiments, one or more of these modules from the image manipulation application 104 are stored in different memory devices of different computing systems.

In some embodiments, the computing system 200 also includes a network interface device 210. The network interface device 210 includes any device or group of devices suitable for establishing a wired or wireless data connection to one or more data networks. Non-limiting examples of the network interface device 210 include an Ethernet network adapter, a modem, and/or the like. The computing system 200 is able to communicate with one or more other computing devices (e.g., a computing device that receives inputs for bid application 102 or displays outputs of the bid application 102) via a data network using a network interface device.

An input device 214 may include any device or group of devices suitable for receiving visual, auditory, or other suitable input that controls or affects the operations of the processor 202. Non-limiting examples of the input device 214 include a touchscreen, stylus, a mouse, a keyboard, a microphone, a separate mobile computing device, etc. A display device 212 may include any device or group of devices suitable for providing visual, auditory, or other suitable sensory output. Non-limiting examples of the display device 212 include a touchscreen, a monitor, a separate mobile computing device, etc.

Although FIG. 2 depicts the input device 214 and the display device 212 as being local to the computing device that executes the bid application 102, other implementations are possible. For instance, in some embodiments, one or more of the input device 214 and the display device 212 may include a remote client-computing device that communicates with the computing system 200 via the network interface device 210 using one or more data networks described herein.

Figure 3:
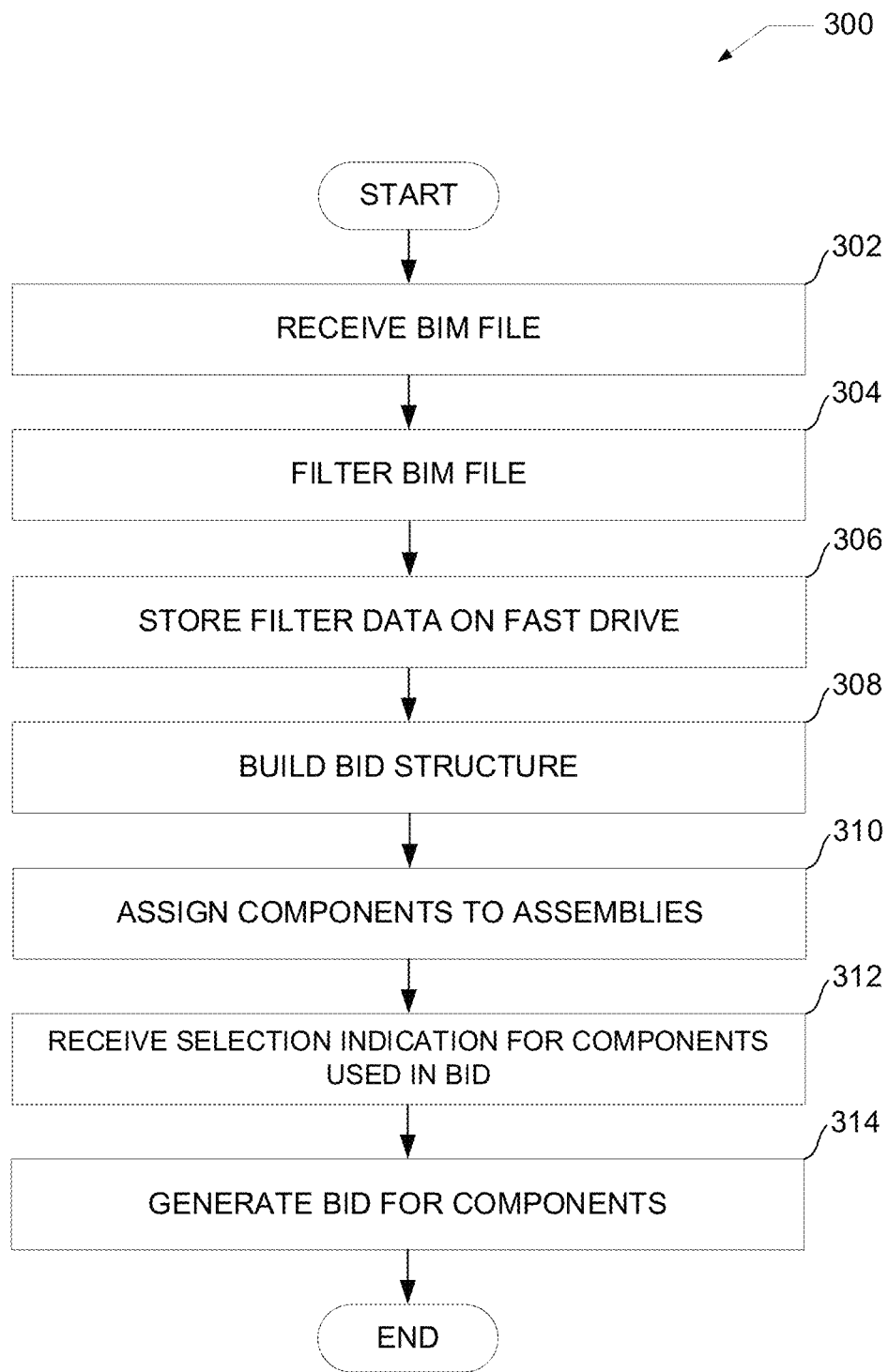
FIG. 3 depicts an example of a process for generating a component and bid display using the bid application, according to certain embodiments of the present disclosure.

FIG. 3 depicts an example of a process 300 for generating a component and bid display 112 using the bid application 102, according to one embodiment of the present disclosure. A computing system, such as the computing system 200, may implement operations depicted in FIG. 3 by executing suitable program code. For illustrative purposes, the process 300 is described with reference to certain examples depicted in the figures. Other implementations, however, are possible.

At block 302, the process 300 involves receiving a BIM file 104, according to some embodiments of the present disclosure. For example, the computing system 200 receives the BIM file 104 from a third-party application. While the process 300 is described with respect to the BIM file 104, other 3D architectural files may also be used. For example, the computing system 200 may receive any form of construction implementation diagram with extractable metadata. In particular embodiments, the bid application 102 extracts all the metadata from the BIM file 104 and stores this information on a storage drive. The bid application 102 may store the extracted metadata from the BIM file 104 in a cloud storage system. In some examples, the data may be arranged in the cloud storage system as a relational database. In some embodiments, the relational database is a database that stores and arranges data together based on a known relationship. For example, the computing system 200 may employ Amazon Web Service's S3 cloud object storing to store the extracted metadata. Continuing with this example, the computing system 200 may move the extracted metadata in the S3 buckets to a relational database, such as Amazon Web Service's Relational Database Service.

At block 304, the process 300 involves filtering a BIM file 104, according to particular embodiments of the present disclosure. In some embodiments, the computing system 200 performs a filtering procedure on the metadata extracted from the BIM file 104. In at least one embodiment, the BIM filter module filters the metadata of the BIM file 104 stored in the relational database. The computing system 200 may use a variety of algorithms to filter data stored in the storage data. In an example, the computing system 200 may extract the filtered data and perform a further level of filtering. In some embodiments, the computing system 200 receives filter terms related to the data from a user. The filter terms may pertain to specific components of the metadata extracted from the BIM file 104. For example, the computing system 200 may receive a request from a door installer to include only the metadata associated with doors in the BIM file 104. The computing system 200 may filter out data that is not relevant to the filter terms to generate filter data associated with the BIM file 104 that is relevant to the filter terms.

At bock 306, the process 300 involves storing the filter data on a high-availability storage, according to one embodiment of the present disclosure. In various embodiments, the entirety of the extracted data from the BIM filter module 108 may be stored in the cloud storage system. Upon filtering the extracted data, the filter data relevant to the filter terms may be stored in the high-availability storage, such as a high-availability storage, while the entirety of the extracted data remains in cloud storage. In certain embodiments, the high-availability storage is operatively designed to store pertinent extracted metadata and may communicate such metadata at a substantially greater speed then the cloud storage system. In one or more embodiments, the high-availability storage may store the filtered metadata that remains readily available to the user. For example, the high-availability storage stores data related to a particular project's door types. Operation of the high-availability storage may include storage of the filtered metadata at high-availability tables stored in a structured query language (SQL) server.

At block 308, the process 300 involves building a bid structure, according to one embodiment of the present disclosure. In some embodiments, the computing system 200 builds the bid structure that includes a two-dimensional rendering of the project using the three-dimensional data of the BIM file 104. In an example, building the bid structure may also include arranging components and defining them as shapes, assigning shapes to particular assemblies, and creating cost estimates of the assemblies based on stored price data. In particular embodiments, the computing system 200 displays the two-dimensional rendering in an adaptive user interface. The computing system 200 may toggle particular component families on the two dimensional rendering, select a component to be removed, add new components, annotate the two-dimensional rendering, and perform other editing and markup actions. In some embodiments, the computing system 200 may translate the edits performed on the two-dimensional rendering into future bid estimates for the particular project.

At block 310, the process 300 involves assigning components to an assembly, according to one embodiment of the present disclosure. In particular embodiments, an assembly is defined as a specific building component and its corresponding data for a particular project. For example, a ⅞" stucco wall with a total area of 33.01 cubic feet in a particular project may be defined as an assembly unit. In one or more embodiments, the computing system 200 assigns components to assemblies based on metadata associated with the components. For example, the computing system 200 may identify a wooden door with specific dimensions from its metadata as a component and assign the component to a particular assembly. In particular embodiments, the computing system 200 may employ a user interface that enables a user to edit assemblies. Editing assemblies may include, but is not limited to, correcting errors, adding missing components, or redefining particular assemblies and/or components.

At block 312, the process 300 involves receiving a selection indication for components used in the bid estimate, according to one embodiment of the present disclosure. In some embodiments, the bid application 102 receives a component toggle selection from the user. In particular embodiments, toggling is defined as selecting and enabling components for consideration in the bid estimate. For example, the bid application 102 will only use components in the bid estimate that the user toggles for inclusion. In various embodiments, the bid application 102 generates a selection table that enables a user to select the components the user would like included in a bid estimate—at least one component and up to all components. For example, an electrician will use the bid application 102 to toggle components specific to the electrician (e.g., outlets, wiring, and light fixtures) for their bid estimate when the filtering process included additional components unrelated to the electrician's bid in the selection table.

At block 314, the process 300 involves generating a bid estimate for selected components, according to one embodiment of the present disclosure. In at least one embodiment, the computing system 200 produces a bid estimate based on the selected components and assemblies of the particular project. In some embodiments, the bid module 110 uses pricing data and algorithms to measure the total cost of a particular project. In some embodiments, the bid module 110 may also produce estimates for total revenue, total profit, total cost of labor, total wholesale cost of supplies, percent returns on overall project, and other financial data points related to the project. The computing system 200 may export any bid estimate as a spreadsheet for further processing by the user.

Figure 4:
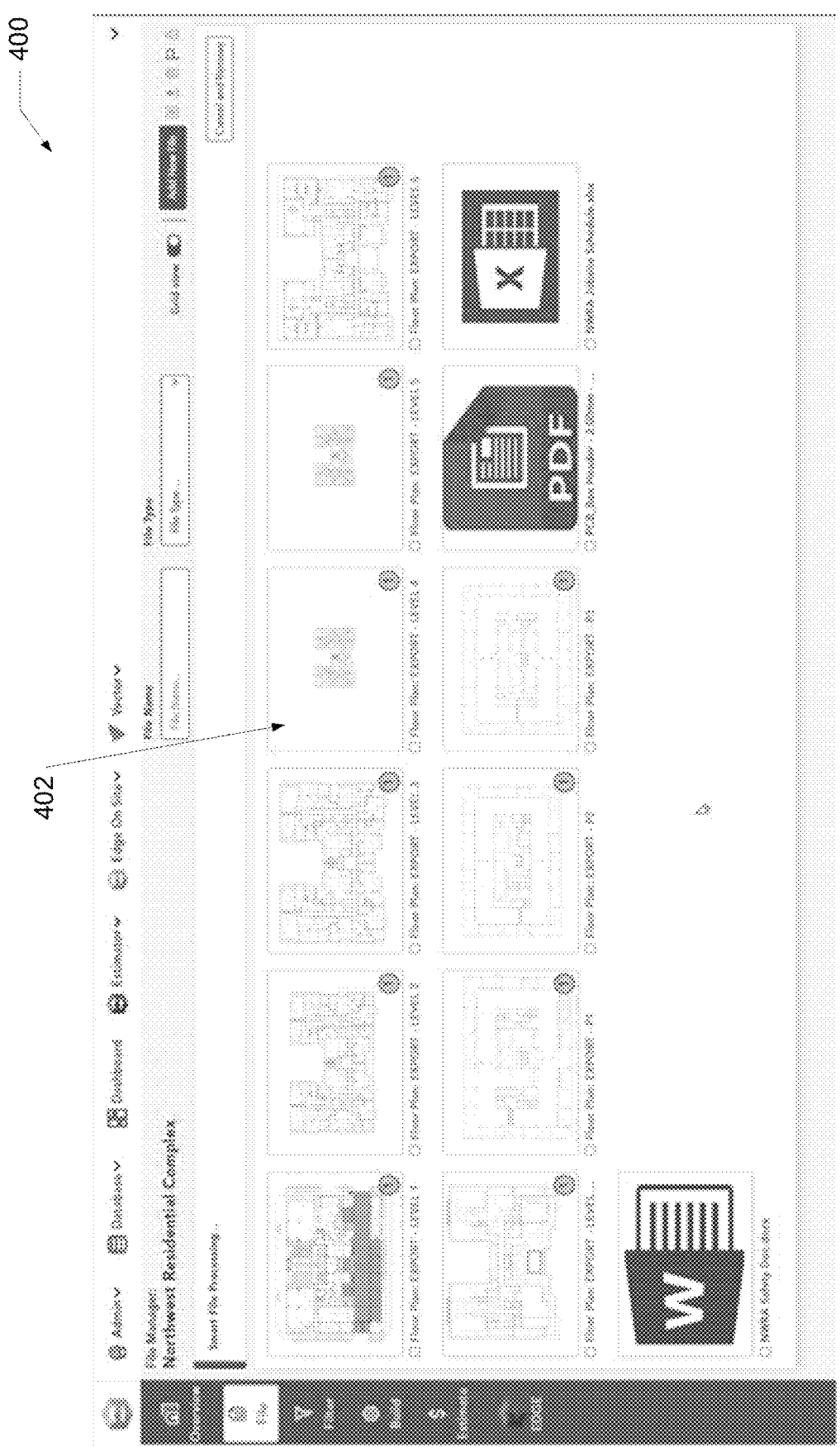
FIG. 4 illustrates a dashboard for organizing extracted BIM data, according to certain embodiments of the present disclosure.

Referring now to FIG. 4, illustrated is a dashboard 400 for organizing extracted BIM data, according to certain embodiments of the present disclosure. The computing system 200 may generate a user interface that enables a user to organize and manage extracted data from the BIM file 104 and other files submitted to the computing system 200. In particular embodiments, the computing system 200 may store this data onto the memory 204 for further processing. In some embodiments, the computing system 200 stores two-dimensional construction plans 402 in the memory 204 and displays the two-dimensional construction plans 402 on the dashboard 400. In some embodiments, the memory 204 is either local or managed in a cloud-computing environment.

Figure 5:
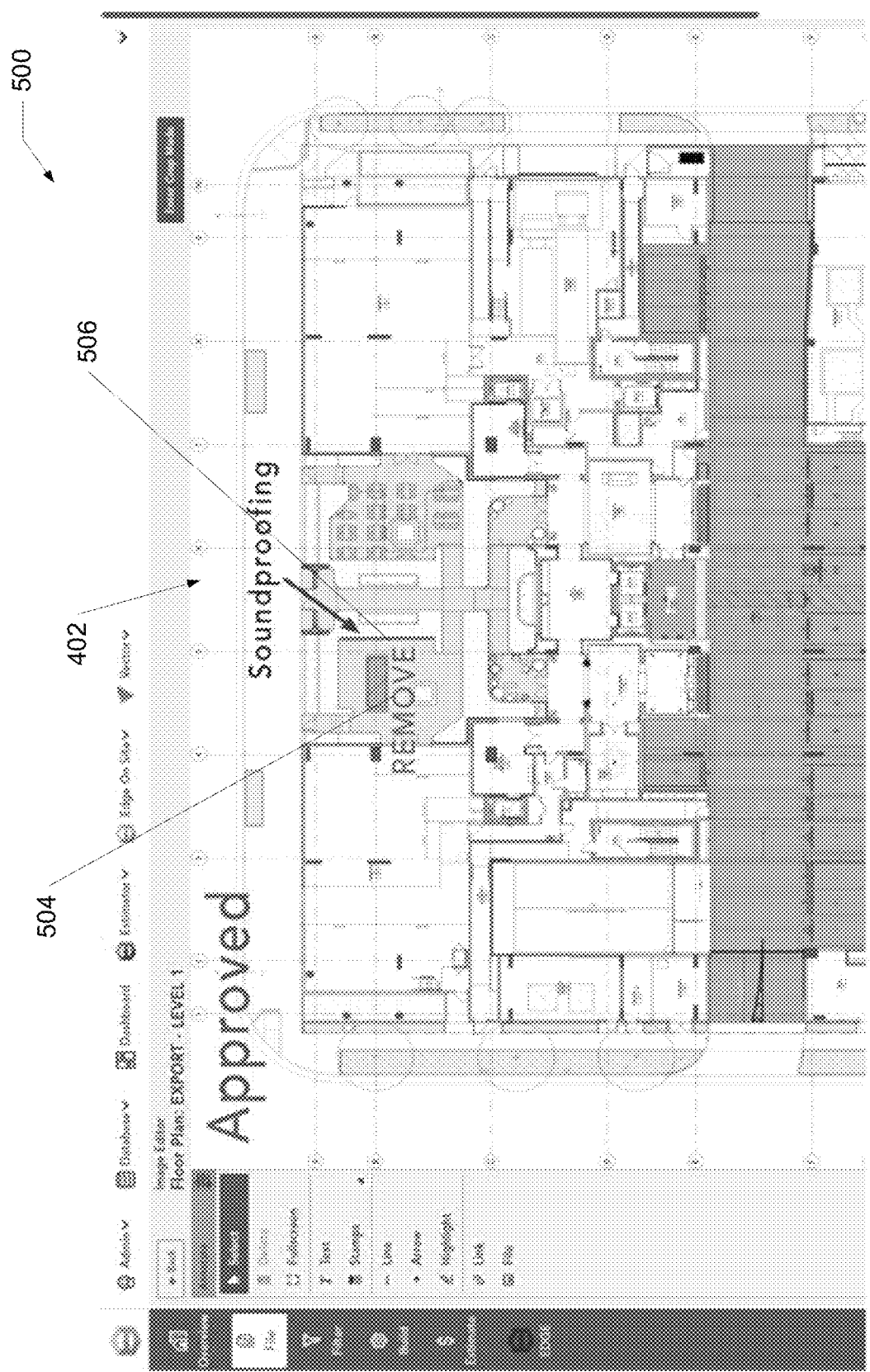
FIG. 5 illustrates an editing interface of the two-dimensional construction plan, according to certain embodiments of the present disclosure.

Referring now to FIG. 5, illustrated is an editing interface of the two-dimensional construction plan 402, according to certain embodiments of the present disclosure. In one or more embodiments, the computing system 200 provides an image editor 500, which enables the user to send edit requests relative to the two-dimensional construction plan 402 to other users of the bid application 102. For example, the computing system 200 may receive a request to remove a soundproofing component 506 from the two-dimensional construction plan 402. In certain embodiments, the computing system 200 may receive note requests from a user to add annotations 504 to the two-dimensional construction plan 402.

Figure 6:
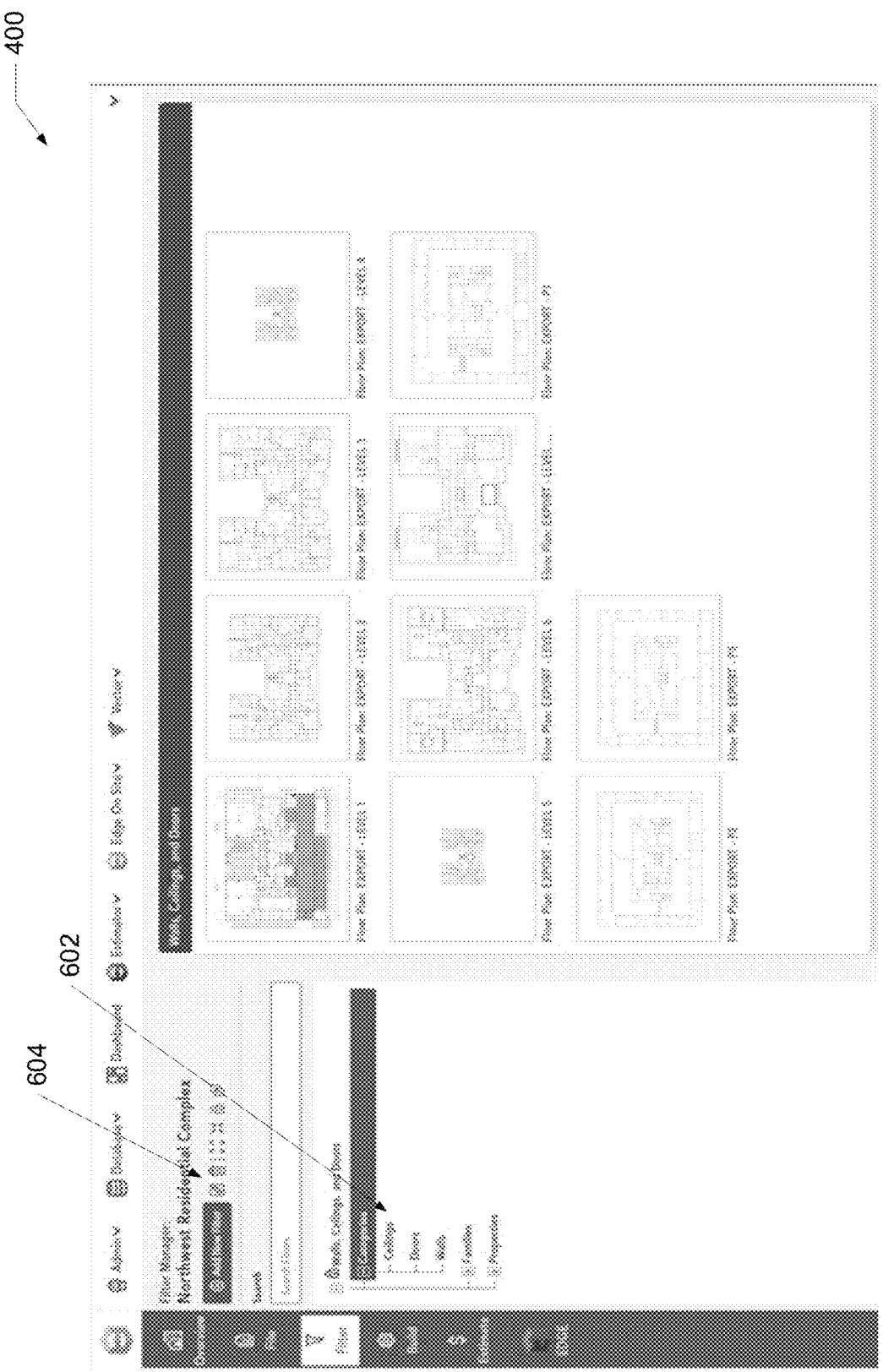
FIG. 6 illustrates a filter manager, according to certain embodiments of the present disclosure.

Referring now to figure FIG. 6, illustrated is a filter manager 602, according to certain embodiments of the present disclosure. In some embodiments, the dashboard 400 includes the filter manager 602. In various embodiments, the filter manager 602 organizes the filters by component types.

In at least one embodiment, the filter manager 602 includes an editing toolbar 604 to adjust, add, or remove particular filters.

Figure 7:
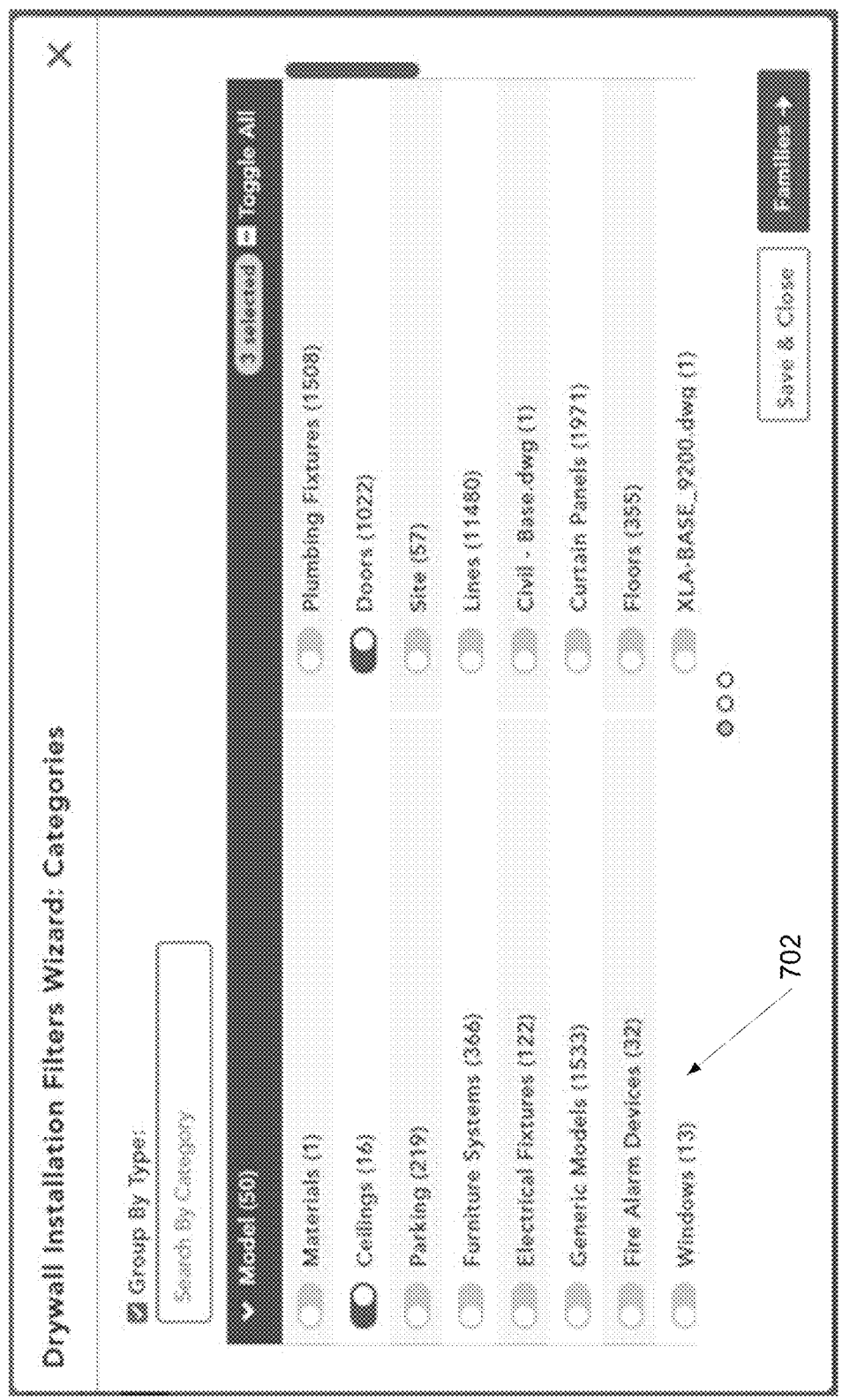
FIG. 7 illustrates a "categories" user interface of a filter task manager, according to certain embodiments of the present disclosure.

Referring now to FIG. 7, illustrated is a "categories" user interface of a filter task manager 700, according to certain embodiments of the present disclosure. In various embodiments, the filter task manager 700 includes categories 702 extracted from the metadata of the BIM file 104. The computing system 200 provides and displays a filter toggle interface that enables the user to select specific categories 702. For example, the user may deselect the window component and select the ceiling component. Continuing this example, the computing system 200 downloads the filtered data from data storage, such as the cloud storage system, to the high-availability drive, which is able to efficiently provide the pertinent information to the user.

Figure 8:
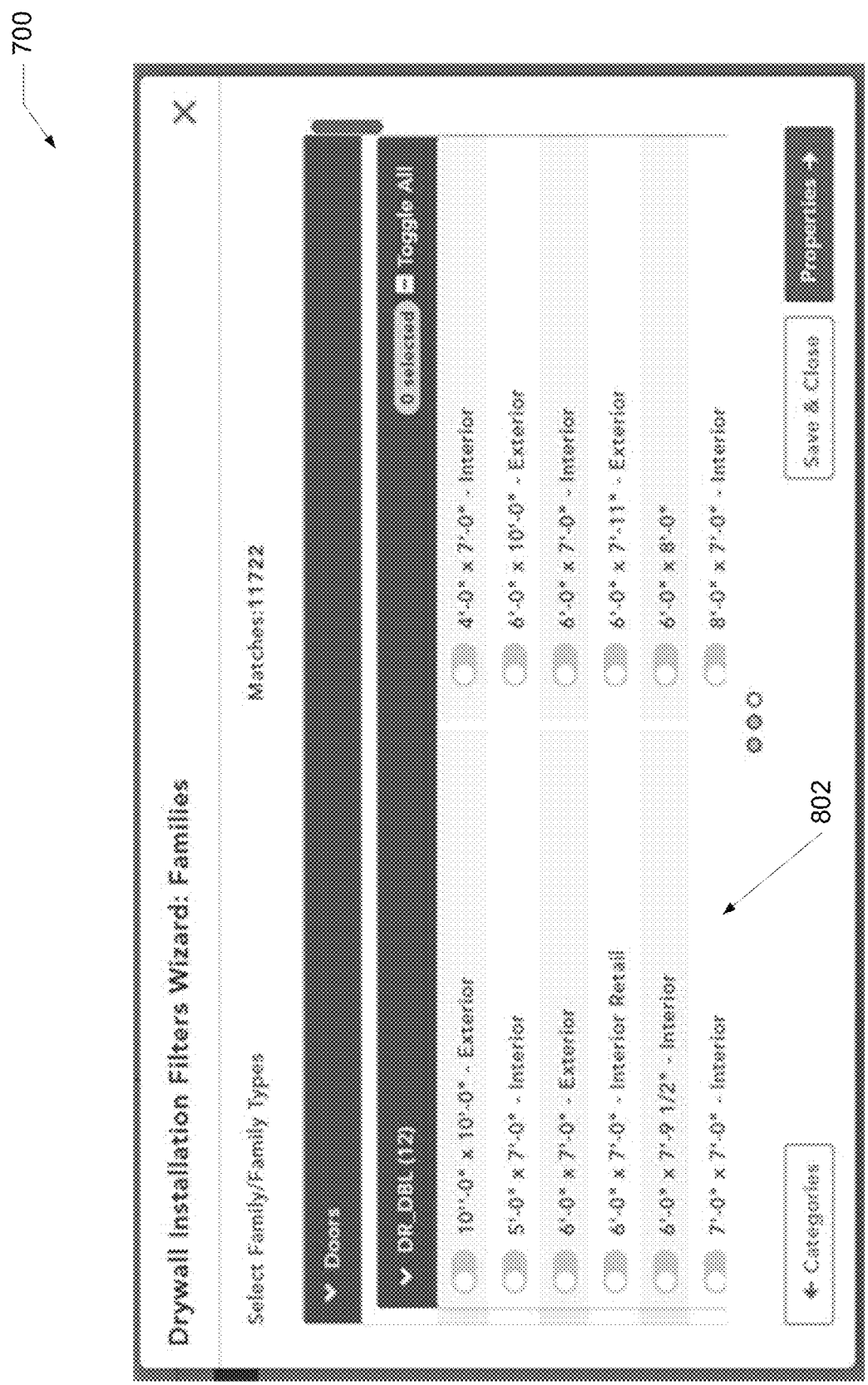
FIG. 8 illustrates a "families" user interface of a filter task manager, according to certain embodiments of the present disclosure.

Referring now to FIG. 8, illustrated is a "families" user interface 802 of the filter task manager 700, according to certain embodiments of the present disclosure. After the computing system 200 receives a selection of the categories 702 from the user, the bid application displays a selection interface for families 802. In some embodiments, the families 802 are defined as sub-components of specific categories 702. For example, if doors are considered a category 702, a door with a specified size is considered the family 802. In some embodiments, the computing system 200 enables the user to select the families 802 that the user would like to include in their bid estimate.

Figure 9:
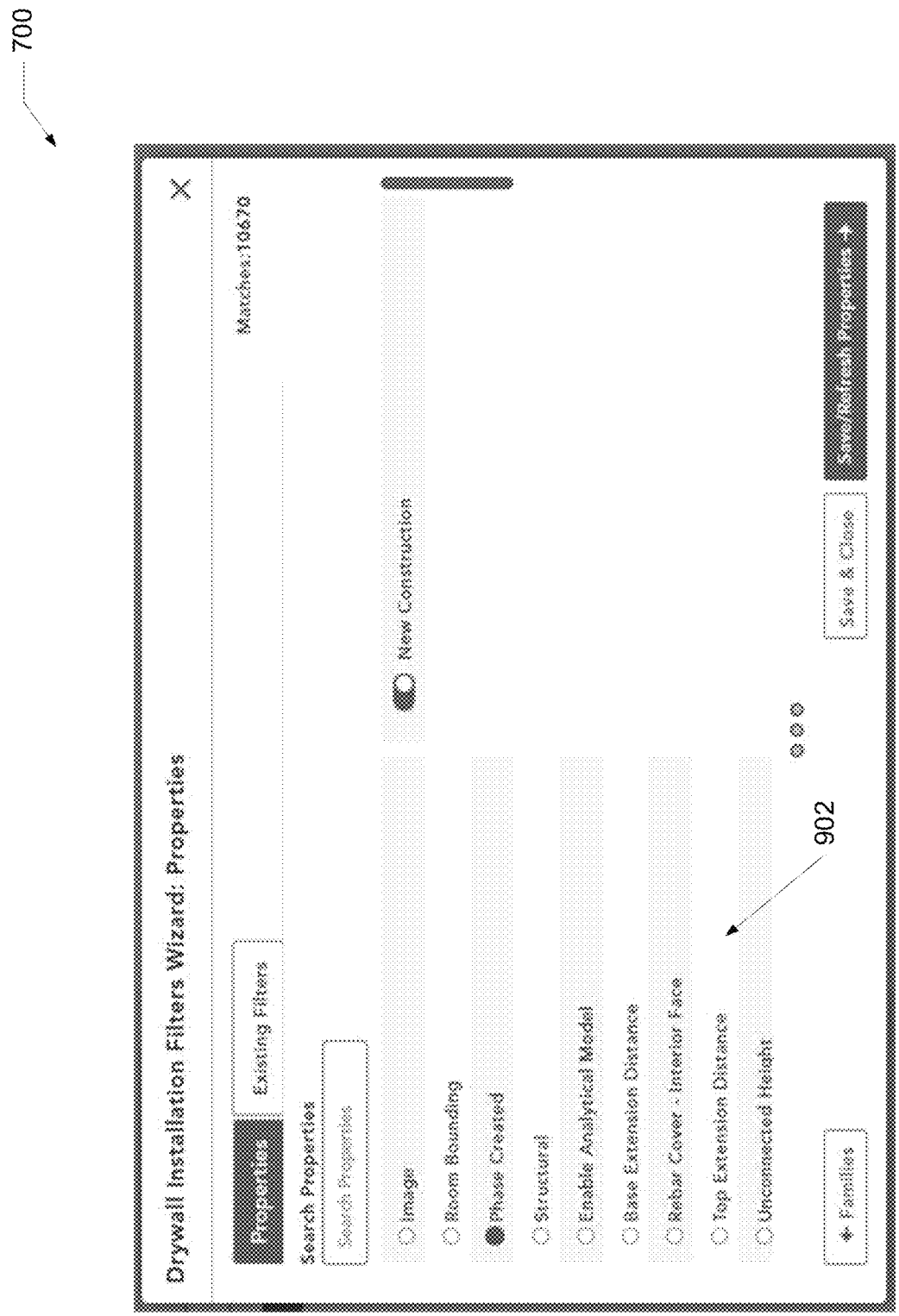
FIG. 9 illustrates a "properties" user interface of a filter task manager, according to certain embodiments of the present disclosure.

Referring now to FIG. 9, illustrated is a "properties" user interface of the filter task manager 700, according to certain embodiments of the present disclosure. In one or more embodiments, properties 902 are defined as specific features that relate to the selected component and how the selected component integrates into the two-dimensional construction plan 402. In some embodiments, the computing system 200 receives selection information related to the particular properties 902. In various embodiments, the computing system 200 uses the selected properties 902 to refine bid estimates.

Figure 10:
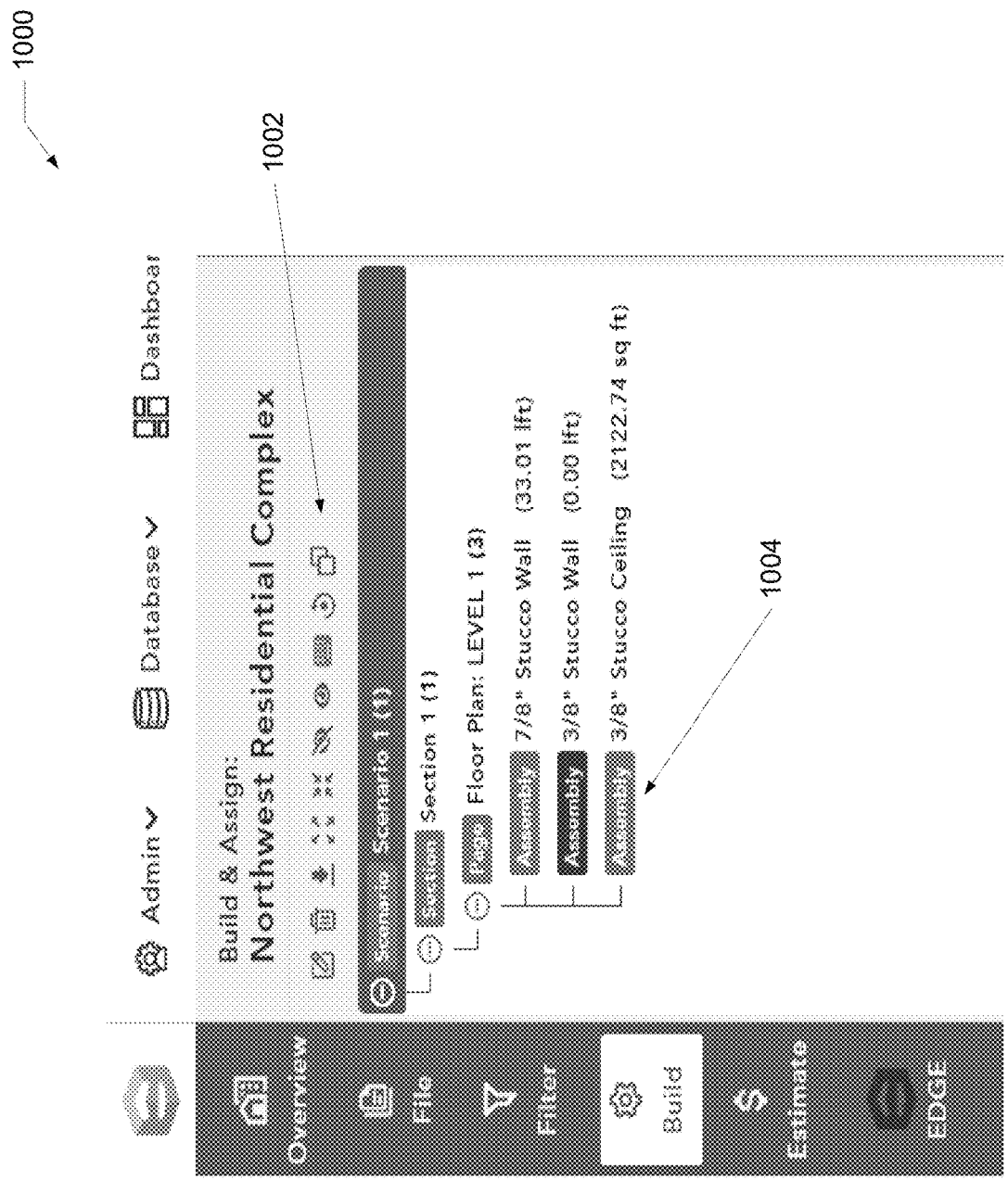
FIG. 10 illustrates an assembly viewer, according to certain embodiments of the present disclosure.

Referring now to FIG. 10, illustrated is an assembly viewer 1000, according to certain embodiments of the present disclosure. In particular embodiments, the computing system 200 generates the assembly viewer 1000 for the user. In some embodiments, the computing system 200 displays an assembly information bar 1002 that enables the user to observe information about specified assemblies 1004. The assembly information bar 1002 may, for example, show particular measurements associated with the specified assemblies 1004 that are obtained during the filtering process provided by the filter task manager 700.

Figure 11:
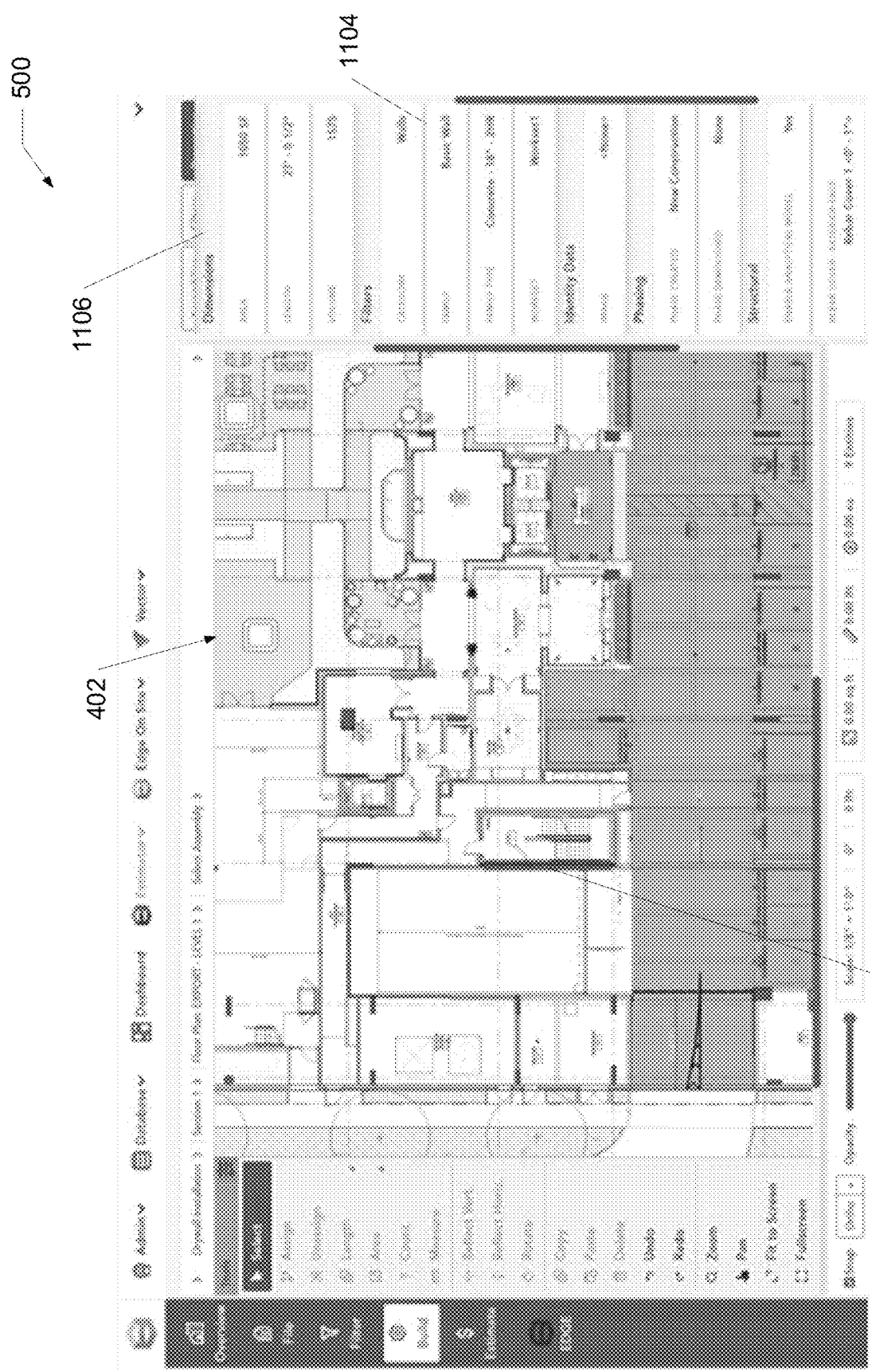
FIG. 11 illustrates a two-dimensional entities viewer of the image editor, according to certain embodiments of the present disclosure.

Referring now to FIG. 11, illustrated is a two-dimensional entities viewer of the image editor 500, according to certain embodiments of the present disclosure. In various embodiments, the computing system 200 displays a single family 802 on a two-dimensional construction plan 402 through a generated user interface. In one example, a user has selected to display a Basic Wall family 1104 on the two-dimensional construction plan 402 on the user interface. In some embodiments, the computing system 200 shows the selected family data 1106. Within the selected family data 1106, the computing system 200 displays properties related to the selected family data 1106. In particular embodiments, the computing system 200 generally uses the combination of the total structural information of each family, along with other estimation information, to produce data information that the computing system 200 exports or uses for further processing. When the single family 802 is selected in the user interface, a component 1108 within the two-dimensional construction plan 402 that is identified as the Basic Wall family 1104 may be highlighted within the two-dimensional construction plan 402.

Figure 12:
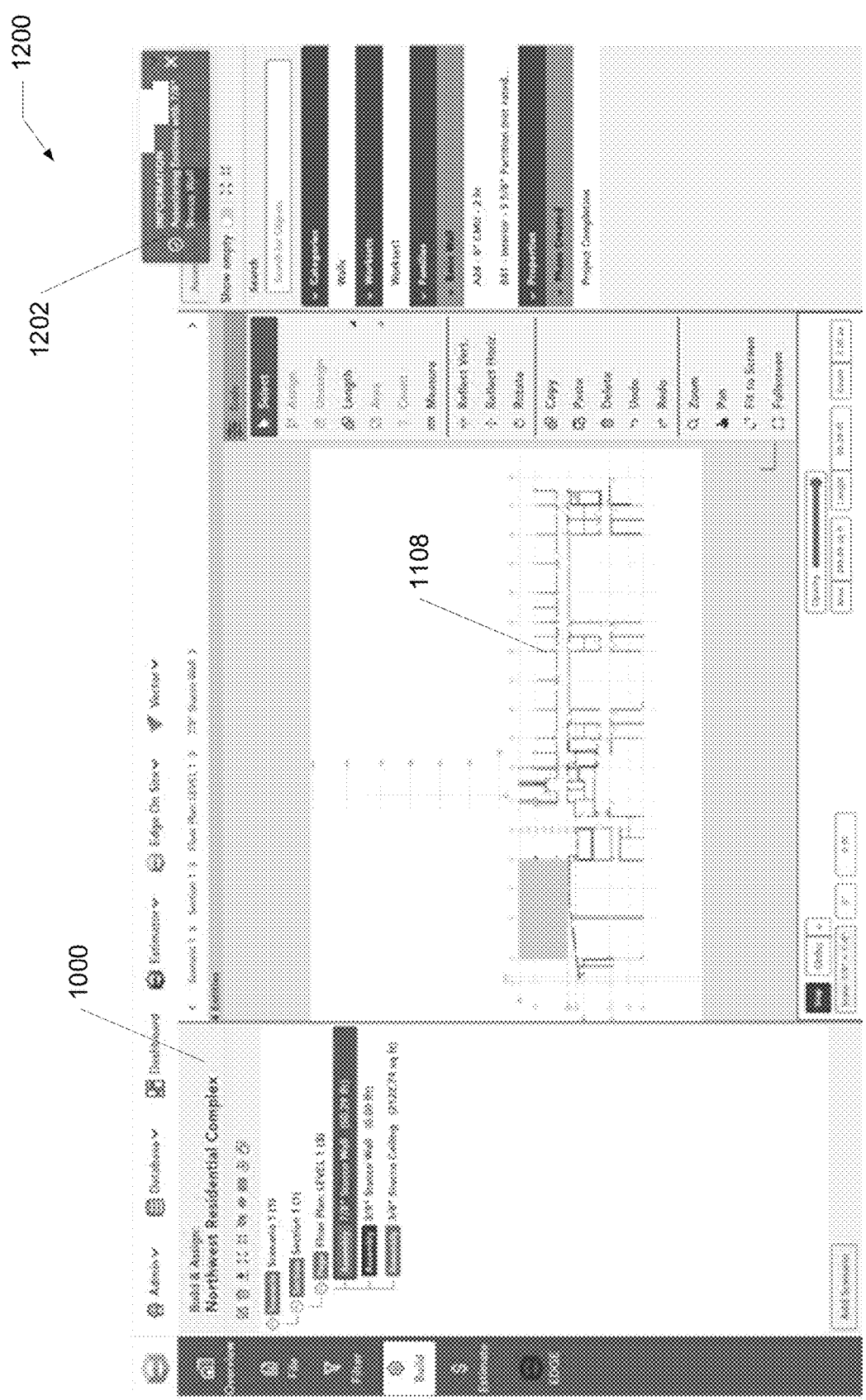
FIG. 12 illustrates a component assignment user interface, according to certain embodiments of the present disclosure.

Referring now to FIG. 12, illustrated is a component assignment user interface 1200, according to certain embodiments of the present disclosure. In at least one embodiment, the computing system 200 receives assignment updates input by a user through the component assignment interface 1200. For example, the components 1108 representing a basic wall may be assigned a specific assembly by a user or automatically based on metadata associated with the components 1108. In various embodiments, the computing system 200 sends a notification 1202 notifying the user that the computing system 200 successfully updated the component assignment information. In one or more embodiments, the assignment user interface 1200 includes the assembly viewer 1000.

Figure 13:
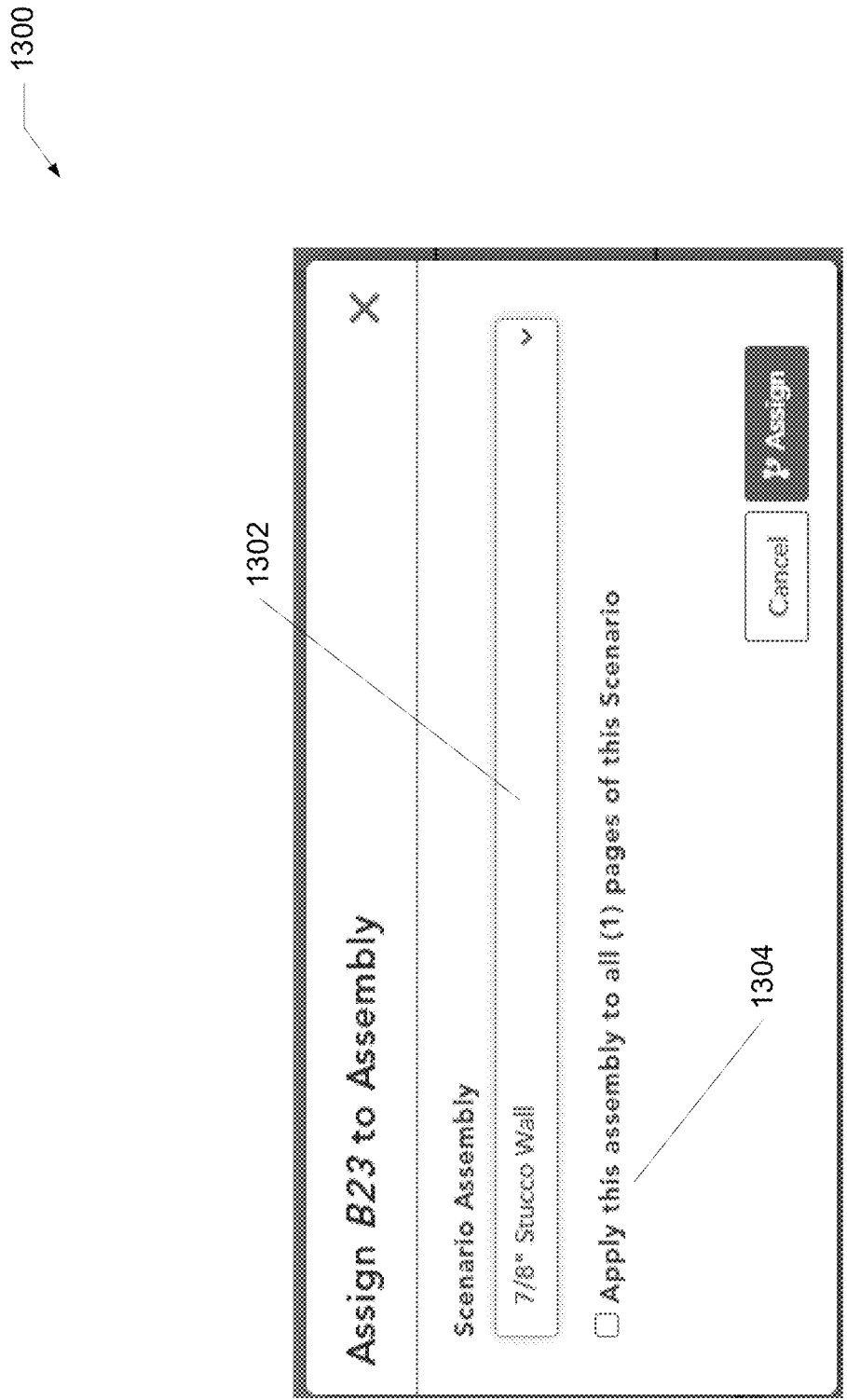
FIG. 13 illustrates an assembly assignment selector, according to certain embodiments of the present disclosure.

Referring now to FIG. 13, illustrated is an assembly assignment selector 1300, according to certain embodiments of the present disclosure. In one or more embodiments, the computing system 200 provides a user with an assignment selector 1300. In particular embodiments, the computing system 200 provides a dropdown menu 1302 where the user may select the assembly that the user would like to include in the bid estimate to represent a particular component depicted in the two-dimensional drawing 402. In one or more embodiments, the computing system 200 may propagate this selection to each page of the project by receiving a confirmation 1304.

Figure 14:
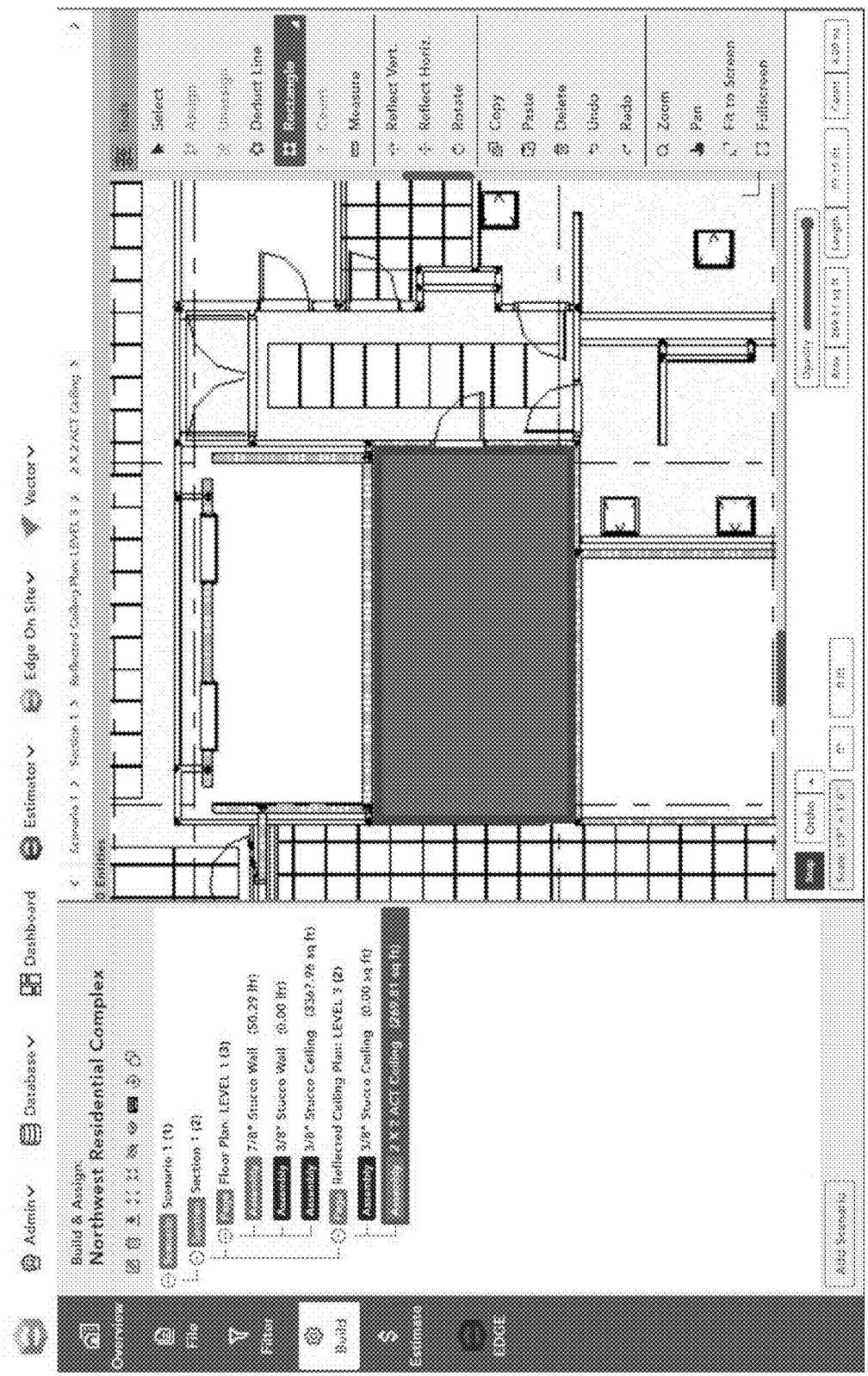
FIG. 14 illustrates a corrections interface for adding additional takeoff components, according to certain embodiments of the present disclosure.

Referring now to FIG. 14, illustrated is a corrections interface 1400 for adding additional takeoff components, according to certain embodiments of the present disclosure. In one or more embodiments, the computing system 200 provides the user with the corrections interface 1400 to add additional takeoff components not initially included when generating the two-dimensional construction plan 402. For example, the bid application may receive new information related to ceiling properties of the two-dimensional construction plan 402.

Figure 15:
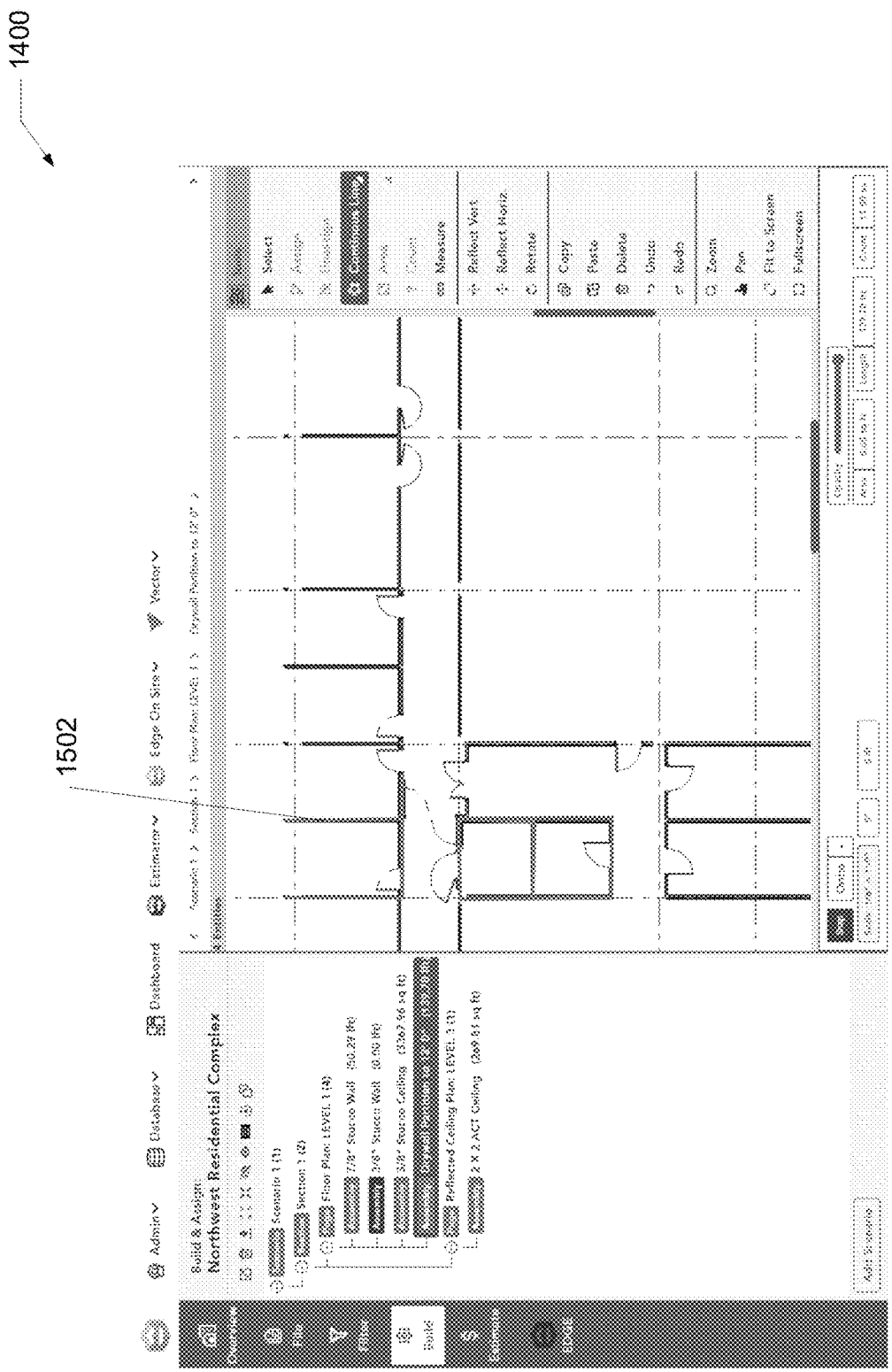
FIG. 15 illustrates a component selection interface of the corrections interface, according to certain embodiments of the present disclosure.

Referring now to FIG. 15, illustrated is a component selection interface of the corrections interface 1400, according to certain embodiments of the present disclosure. In various embodiments, the computing system 200 highlights selected bid components 1502 on the two-dimensional construction plan 402. In some examples, the selected bid components 1502 may be three-dimensional elements that are added separately to the two-dimensional construction plan 402. In certain embodiments, the computing system 200 embeds the highlighted components 1502 into the two-dimensional construction plan 402 for future processing.

Figure 16:
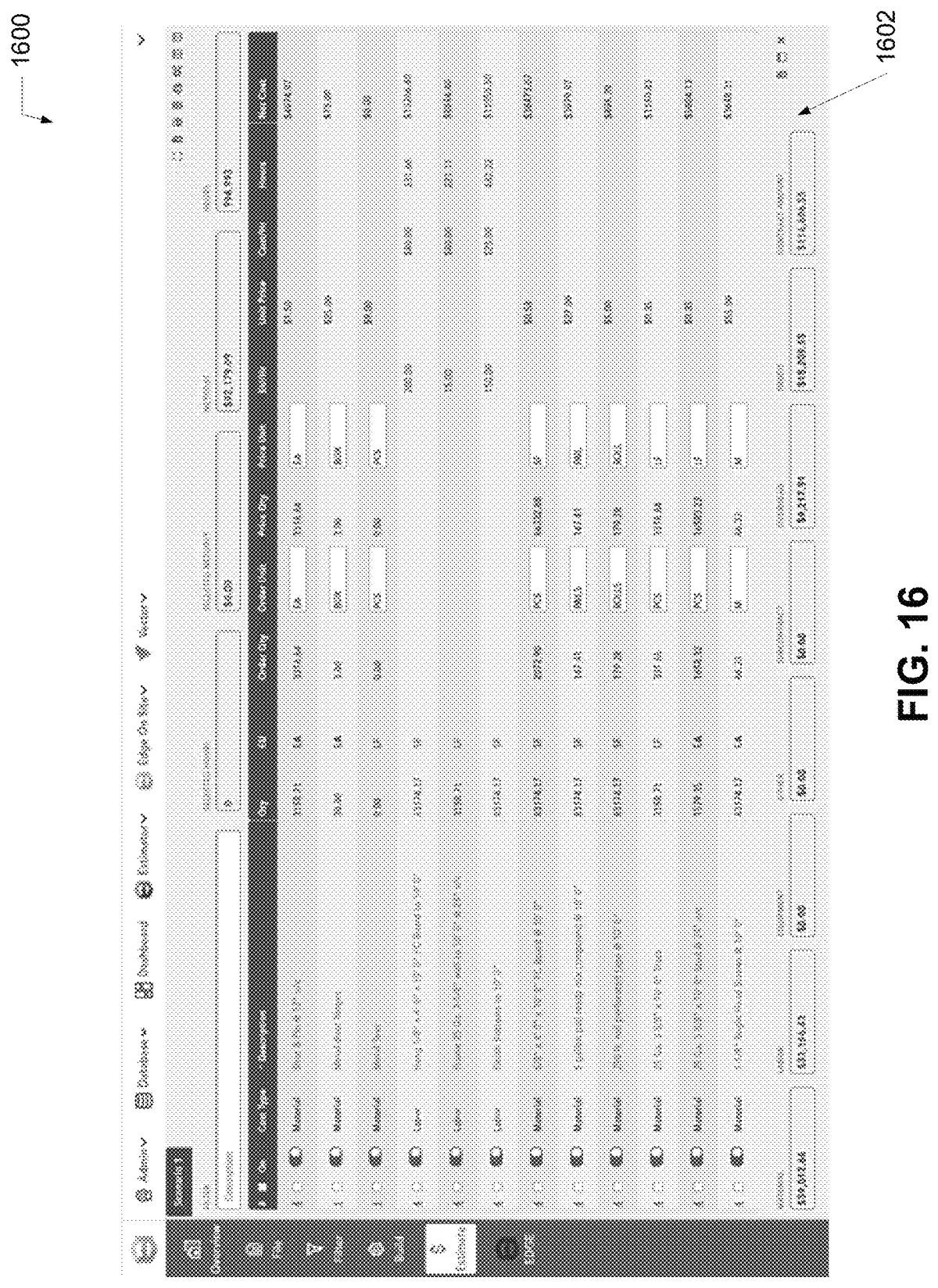

Referring now to FIG. 16, illustrated is an estimate page 1600, according to certain embodiments of the present disclosure. In some embodiments, the computing system 200 produces the estimation values 1602 for a particular project. The estimation values 1602 may include, but are not limited to, contract amounts, profits, overhead, subcontracts, equipment, labor costs, material costs, or any other features with a value component. In particular embodiments, the computing system 200 may receive and apply edit requests for the estimate page 1600. In certain embodiments, the bid application may export this information as a spreadsheet or any other form of data file for further processing.

CONCLUSION

Aspects, features, and benefits of the systems, methods, processes, formulations, apparatuses, and products discussed herein will become apparent from the information disclosed in the exhibits and the other applications as incorporated by reference. Variations and modifications to the disclosed systems and methods may be effected without departing from the spirit and scope of the novel concepts of the disclosure.

It will, nevertheless, be understood that no limitation of the scope of the disclosure is intended by the information disclosed in the exhibits or the applications incorporated by reference; any alterations and further modifications of the described or illustrated embodiments, and any further applications of the principles of the disclosure as illustrated therein are contemplated as would normally occur to one skilled in the art to which the disclosure relates.

The foregoing description of the exemplary embodiments has been presented only for the purposes of illustration and description and is not intended to be exhaustive or to limit the inventions to the precise forms disclosed. Many modifications and variations are possible in light of the above teaching.

The embodiments were chosen and described to explain the principles of the inventions and their practical application to enable others skilled in the art to utilize the inventions and various embodiments and with various modifications as are suited to the particular use contemplated. Alternative embodiments will become apparent to those skilled in the art to which the present inventions pertain without departing from their spirit and scope. Accordingly, the scope of the present inventions is defined by the appended claims rather than the foregoing description and the exemplary embodiments described therein.

From the foregoing, it will be understood that various aspects of the processes described herein are software processes that execute on computer systems that form parts of the system. Accordingly, it will be understood that various embodiments of the system described herein are generally implemented as specially configured computers including various computer hardware components and, in many cases, significant additional features as compared to conventional or known computers, processes, or the like, as discussed in greater detail herein. Embodiments within the scope of the present disclosure also include computer-readable media for carrying or having computer-executable instructions or data structures stored thereon. Such computer-readable media can be any available media that can be accessed by a computer, or downloadable through communication networks. By way of example, and not limitation, such computer-readable media can comprise various forms of data storage devices or media such as RAM, ROM, flash memory, EEPROM, CD-ROM, DVD, or other optical disk storage, magnetic disk storage, solid state drives (SSDs) or other data storage devices, any type of removable non-volatile memories such as secure digital (SD), flash memory, memory stick, etc., or any other medium which can be used to carry or store computer program code in the form of computer-executable instructions or data structures and which can be accessed by a computer.

When information is transferred or provided over a network or another communications connection (either hardwired, wireless, or a combination of hardwired or wireless) to a computer, the computer properly views the connection as a computer-readable medium. Thus, any such a connection is properly termed and considered a computer-readable medium. Combinations of the above should also be included within the scope of computer-readable media. Computer-executable instructions comprise, for example, instructions and data, which cause a computer to perform one specific function or a group of functions.

Those skilled in the art will understand the features and aspects of a suitable computing environment in which aspects of the disclosure may be implemented. Although not required, some of the embodiments of the claimed inventions may be described in the context of computer-executable instructions, such as program modules or engines, as described earlier, being executed by computers in networked environments. Such program modules are often reflected and illustrated by flow charts, sequence diagrams, exemplary screen displays, and other techniques used by those skilled in the art to communicate how to make and use such computer program modules. Generally, program modules include routines, programs, functions, objects, components, data structures, application programming interface (API) calls to other computers whether local or remote, etc. that perform particular tasks or implement particular defined data types, within the computer. Computer-executable instructions, associated data structures and/or schemas, and program modules represent examples of the program code for executing steps of the methods disclosed herein. The particular sequence of such executable instructions or associated data structures represent examples of corresponding acts for implementing the functions described in such steps.

Those skilled in the art will also appreciate that the claimed and/or described systems and methods may be practiced in network computing environments with many types of computer system configurations, including personal computers, smartphones, tablets, hand-held devices, multi-processor systems, microprocessor-based or programmable consumer electronics, networked PCs, minicomputers, mainframe computers, and the like. Embodiments of the claimed invention are practiced in distributed computing environments where tasks are performed by local and remote processing devices that are linked (either by hard-wired links, wireless links, or by a combination of hardwired or wireless links) through a communications network. In a distributed computing environment, program modules may be located in both local and remote memory storage devices.

An exemplary system for implementing various aspects of the described operations, which is not illustrated, includes a computing device including a processing unit, a system memory, and a system bus that couples various system components including the system memory to the processing unit. The computer will typically include one or more data storage devices for reading data from and writing data to. The data storage devices provide nonvolatile storage of computer-executable instructions, data structures, program modules, and other data for the computer.

Computer program code that implements the functionality described herein typically comprises one or more program modules that may be stored on a data storage device. This program code, as is known to those skilled in the art, usually includes an operating system, one or more application programs, other program modules, and program data. A user may enter commands and information into the computer through keyboard, touch screen, pointing device, a script containing computer program code written in a scripting language or other input devices (not shown), such as a microphone, etc. These and other input devices are often connected to the processing unit through known electrical, optical, or wireless connections.

The computer that effects many aspects of the described processes will typically operate in a networked environment using logical connections to one or more remote computers or data sources, which are described further below. Remote computers may be another personal computer, a server, a router, a network PC, a peer device or other common network node, and typically include many or all of the elements described above relative to the main computer system in which the inventions are embodied. The logical connections between computers include a local area network (LAN), a wide area network (WAN), virtual networks (WAN or LAN), and wireless LANs (WLAN) that are presented here by way of example and not limitation. Such networking environments are commonplace in office-wide or enterprise-wide computer networks, intranets, and the Internet.

When used in a LAN or WLAN networking environment, a computer system implementing aspects of the invention is connected to the local network through a network interface or adapter. When used in a WAN or WLAN networking environment, the computer may include a modem, a wireless link, or other mechanisms for establishing communications over the wide area network, such as the Internet. In a networked environment, program modules depicted relative to the computer, or portions thereof, may be stored in a remote data storage device. It will be appreciated that the network connections described or shown are exemplary and other mechanisms of establishing communications over wide area networks or the Internet may be used.

While various aspects have been described in the context of a preferred embodiment, additional aspects, features, and methodologies of the claimed inventions will be readily discernible from the description herein, by those of ordinary skill in the art. Many embodiments and adaptations of the disclosure and claimed inventions other than those herein described, as well as many variations, modifications, and equivalent arrangements and methodologies, will be apparent from or reasonably suggested by the disclosure and the foregoing description thereof, without departing from the substance or scope of the claims. Furthermore, any sequence(s) and/or temporal order of steps of various processes described and claimed herein are those considered to be the best mode contemplated for carrying out the claimed inventions. It should also be understood that, although steps of various processes may be shown and described as being in a preferred sequence or temporal order, the steps of any such processes are not limited to being carried out in any particular sequence or order, absent a specific indication of such to achieve a particular intended result. In most cases, the steps of such processes may be carried out in a variety of different sequences and orders, while still falling within the scope of the claimed inventions. In addition, some steps may be carried out simultaneously, contemporaneously, or in synchronization with other steps.

The embodiments were chosen and described to explain the principles of the claimed inventions and their practical application so as to enable others skilled in the art to utilize the inventions and various embodiments and with various modifications as are suited to the particular use contemplated. Alternative embodiments will become apparent to those skilled in the art to which the claimed inventions pertain without departing from their spirit and scope. Accordingly, the scope of the claimed inventions is defined by the appended claims rather than the foregoing description and the exemplary embodiments described therein.

What is claimed is:

1. A computer-implemented method in which one or more processing devices perform operations comprising:
    accessing a three-dimensional architectural file of a building;
    extracting architectural data from the three-dimensional architectural file;

rendering, from the architectural data extracted from the three-dimensional architectural file, a two-dimensional drawing representing a floorplan of a floor of the building;
filtering the architectural data to generate a set of filtered data;
storing the set of filtered data in high-availability storage;
overlaying a set of shapes corresponding to a set of assemblies on the two-dimensional drawing;
assigning a set of measurements identified in the set of filtered data to the set of assemblies, wherein assigning a measurement of the set of measurements to an assembly of the set of assemblies comprises modifying a color of a shape corresponding to the assembly to identify the assembly being assigned the measurement; and
compiling values associated with the measurements of the set of assemblies to generate a bid value.

2. The computer-implemented method of claim 1, wherein the operations further comprise:
adding a representation of a missing element to the two-dimensional drawing representation;
assigning an additional measurement identified in the set of filtered data to the representation of the missing element; and
compiling values associated with the additional measurement of the representation of the missing element to generate the bid value.

3. The computer-implemented method of claim 1, wherein the operations further comprise:
storing the extracted architectural data in cloud storage, wherein the set of filtered data is generated by filtering the architectural data in the cloud storage.

4. The computer-implemented method of claim 1, wherein the filtered data comprises metadata associated with the set of assemblies identified during the operation of filtering the architectural data.

5. The computer-implemented method of claim 4, wherein the metadata comprises measurement and location information associated with the set of assemblies.

6. The computer-implemented method of claim 1, wherein the high-availability storage comprises high-availability tables stored in a structured query language (SQL) server.

7. The computer-implemented method of claim 1, wherein the operations further comprise:
filtering the architectural data to generate a second set of filtered data different from the set of filtered data;
removing the set of filtered data from the high-availability storage;
storing the second set of filtered data in the high-availability storage;
assigning a second set of measurements identified in the second set of filtered data to a second set of assemblies; and
compiling second values associated with the second set of measurements of the second set of assemblies to generate a second bid value.

8. The computer-implemented method of claim 1, wherein the architectural data comprises (i) a set of two-dimensional construction plans generated from the three-dimensional architectural file and (ii) a set of metadata associated with building components identified in the three-dimensional architectural file.

9. A system comprising:
a processor; and
a non-transitory computer-readable medium having instructions stored thereon, the instructions executable by the processor for performing operations comprising:
accessing a three-dimensional architectural file of a building;
extracting architectural data from the three-dimensional architectural file;
filtering the architectural data to generate a set of filtered data;
storing the set of filtered data in high-availability storage;
assigning a set of measurements identified in the set of filtered data to a set of assemblies;
compiling values associated with the measurements of the set of assemblies to generate a bid value
filtering the architectural data to generate a second set of filtered data different from the set of filtered data;
removing the set of filtered data from the high-availability storage;
storing the second set of filtered data in the high-availability storage;
assigning a second set of measurements identified in the second set of filtered data to a second set of assemblies; and
compiling second values associated with the second set of measurements of the second set of assemblies to generate a second bid value.

10. The system of claim 9, wherein the operations further comprise:
rendering, from the architectural data extracted from the three-dimensional architectural file, a two-dimensional drawing representing a floorplan of a floor of the building; and
overlaying a set of shapes corresponding to the set of assemblies on the two-dimensional drawing, wherein assigning a measurement of the set of measurements to an assembly of the set of assemblies comprises modifying a color of a shape corresponding to the assembly to identify the assembly being assigned the measurement.

11. The system of claim 9, wherein the architectural data comprises (i) a set of two-dimensional construction plans generated from the three-dimensional architectural file and (ii) a set of metadata associated with building components identified in the three-dimensional architectural file.

12. The system of claim 9, wherein the filtered data comprises metadata associated with the set of assemblies identified during the operation of filtering the architectural data, and wherein the metadata comprises measurement and location information associated with the set of assemblies.

13. The system of claim 9, wherein the operations further comprise:
storing the extracted architectural data in cloud storage, wherein the set of filtered data is generated by filtering the architectural data in the cloud storage.

14. The system of claim 9, wherein the high-availability storage comprises high-availability tables stored in a structured query language (SQL) server.

15. A non-transitory computer-readable medium having program code that is stored thereon, the program code executable by one or more processing devices for performing operations comprising:
accessing a three-dimensional architectural file of a building;

extracting architectural data from the three-dimensional architectural file;
filtering the architectural data to generate a set of filtered data;
storing the set of filtered data in high-availability storage;
assigning a set of measurements identified in the set of filtered data to a set of assemblies;
rendering, from the architectural data extracted from the three-dimensional architectural file, a two-dimensional drawing representing a floorplan of a floor of the building; and
overlaying a set of shapes corresponding to the set of assemblies on the two-dimensional drawing, wherein assigning a measurement of the set of measurements to an assembly of the set of assemblies comprises modifying a color of a shape corresponding to the assembly to identify the assembly being assigned the measurement; and compiling values associated with the measurements of the set of assemblies to generate a bid value.

16. The non-transitory computer-readable medium of claim 15, wherein the architectural data comprises (i) a set of two-dimensional construction plans generated from the three-dimensional architectural file and (ii) a set of metadata associated with building components identified in the three-dimensional architectural file.

17. The non-transitory computer-readable medium of claim 15, wherein the operations further comprise:
storing the extracted architectural data in cloud storage, wherein the set of filtered data is generated by filtering the architectural data in the cloud storage.

18. The non-transitory computer-readable medium of claim 15, wherein the high-availability storage comprises high-availability tables stored in a structured query language (SQL) server.

* * * * *